(12) United States Patent
Karda et al.

(10) Patent No.: US 11,495,600 B2
(45) Date of Patent: Nov. 8, 2022

(54) VERTICAL THREE-DIMENSIONAL MEMORY WITH VERTICAL CHANNEL

(71) Applicant: Micron Technology, Inc., Boise, ID (US)

(72) Inventors: Kamal M. Karda, Boise, ID (US); Haitao Liu, Boise, ID (US); Litao Yang, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 100 days.

(21) Appl. No.: 17/093,869

(22) Filed: Nov. 10, 2020

(65) Prior Publication Data

US 2022/0149046 A1    May 12, 2022

(51) Int. Cl.
*H01L 27/108* (2006.01)
*G11C 11/408* (2006.01)

(52) U.S. Cl.
CPC .... *H01L 27/10805* (2013.01); *G11C 11/4085* (2013.01); *H01L 27/10891* (2013.01)

(58) Field of Classification Search
None
See application file for complete search history.

(56) References Cited

U.S. PATENT DOCUMENTS

| | | | |
|---|---|---|---|
| 9,142,557 B2 | 9/2015 | Lee | |
| 10,607,995 B2 | 3/2020 | Roberts et al. | |
| 2012/0094454 A1 | 4/2012 | Cho et al. | |
| 2013/0001663 A1 | 1/2013 | Abbott et al. | |
| 2018/0061835 A1 | 3/2018 | Yang et al. | |
| 2018/0323200 A1 | 11/2018 | Tang et al. | |
| 2018/0122798 A1 | 12/2018 | Ramaswamy | |
| 2019/0103406 A1 | 4/2019 | Tang et al. | |
| 2019/0164985 A1 | 5/2019 | Lee et al. | |
| 2019/0221567 A1 | 7/2019 | Sandhu | |
| 2019/0304979 A1 | 10/2019 | Ahn | |
| 2020/0168610 A1 | 5/2020 | Lu | |

(Continued)

FOREIGN PATENT DOCUMENTS

CN   109841630 A   6/2019
KR   10-2012-0039366 A   4/2012

(Continued)

OTHER PUBLICATIONS

U.S. Appl. No. 16/204,224, entitled, "Memory Arrays," filed Nov. 29, 2018, 43 pages.

(Continued)

*Primary Examiner* — Anthony Ho
*Assistant Examiner* — Kevin Quinto
(74) *Attorney, Agent, or Firm* — Brooks, Cameron & Huebsch, PLLC

(57) ABSTRACT

Systems, methods and apparatus are provided for an array of vertically stacked memory cells having vertically oriented access devices having a first source/drain region and a second source drain region vertically separated by a channel region, and gates opposing the channel region, vertically oriented access lines coupled to the gates and separated from a channel region by a gate dielectric. The memory cells have horizontally oriented storage nodes coupled to the first source/drain region and horizontally oriented digit lines coupled to the second source/drain regions.

28 Claims, 25 Drawing Sheets

(56) References Cited

U.S. PATENT DOCUMENTS

2020/0279601 A1    9/2020  Kim et al.
2021/0183868 A1*   6/2021  Chern ................... H01L 29/945

FOREIGN PATENT DOCUMENTS

TW    201532247 A    8/2015
TW    202034501 A    9/2020

OTHER PUBLICATIONS

International Search Report and Written Opinion from related international application No. PCT/US2021/055381, dated Feb. 3, 2022, 9 pages.
Office Action from related Taiwan Patent Application No. 110139977, dated Jun. 8, 2022, 10 pages.

* cited by examiner

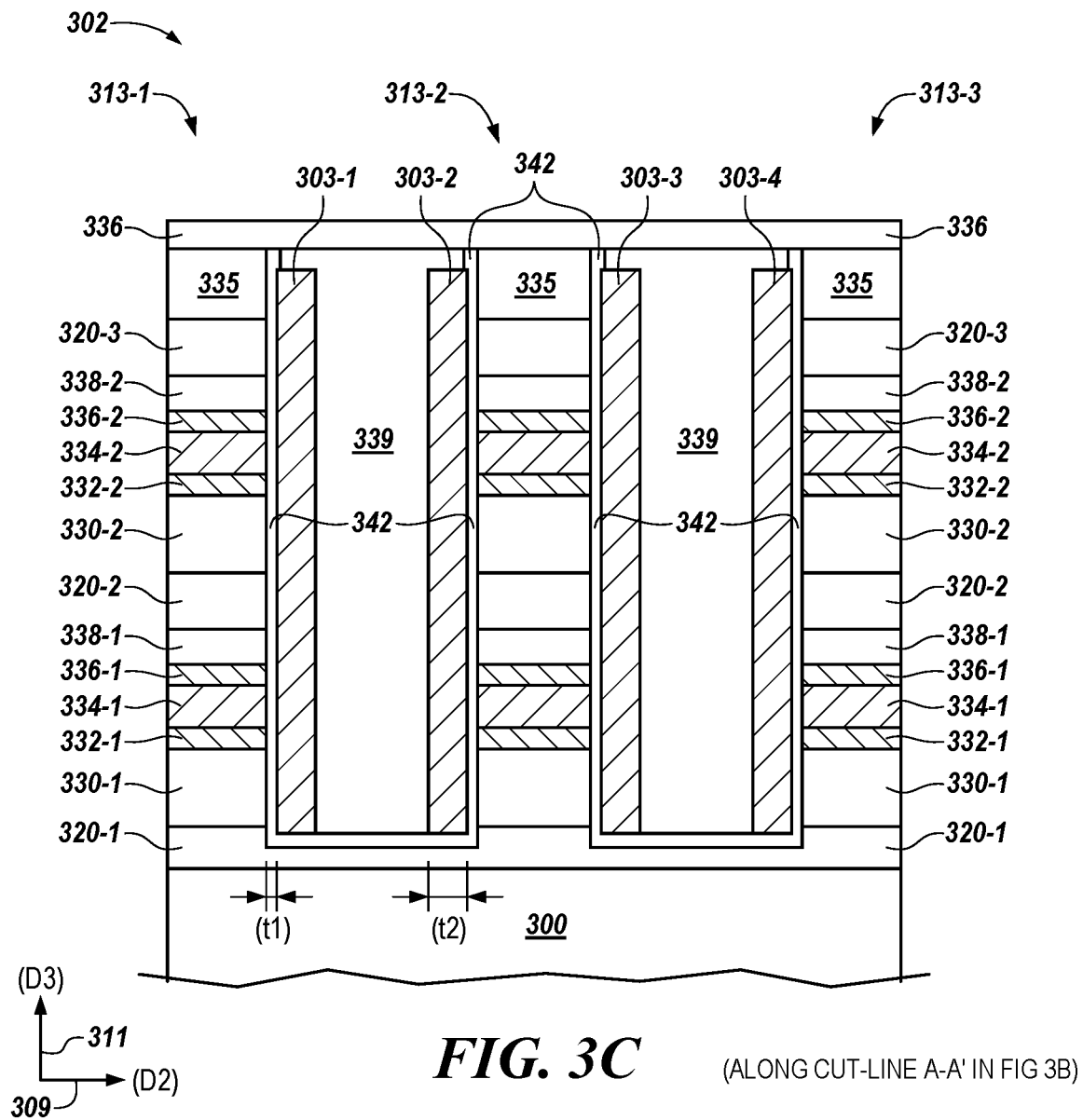
FIG. 3C (ALONG CUT-LINE A-A' IN FIG 3B)

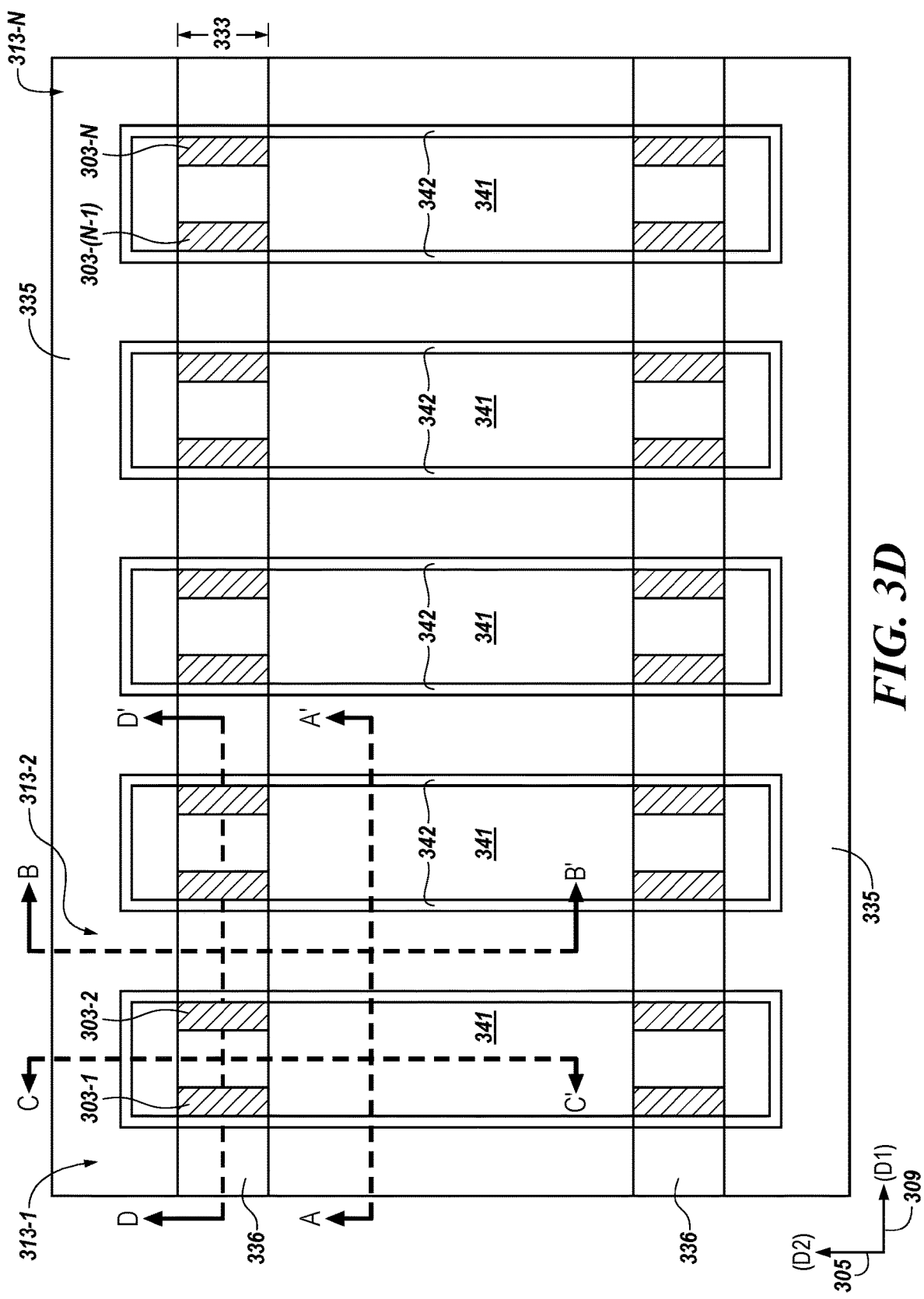

VERTICAL THREE-DIMENSIONAL MEMORY WITH VERTICAL CHANNEL

TECHNICAL FIELD

The present disclosure relates generally to memory devices, and more particularly, to a three-dimensional memory having a vertically oriented access device with a vertical channel.

BACKGROUND

Memory is often implemented in electronic systems, such as computers, cell phones, hand-held devices, etc. There are many different types of memory, including volatile and non-volatile memory. Volatile memory may require power to maintain its data and may include random-access memory (RAM), dynamic random-access memory (DRAM), static random-access memory (SRAM), and synchronous dynamic random-access memory (SDRAM). Non-volatile memory may provide persistent data by retaining stored data when not powered and may include NAND flash memory, NOR flash memory, nitride read only memory (NROM), phase-change memory, e.g., phase-change random access memory, resistive memory, e.g., resistive random-access memory, cross-point memory, ferroelectric random-access memory (FeRAM), or the like.

As design rules shrink, less semiconductor space is available to fabricate memory, including DRAM arrays. A respective memory cell for DRAM may include an access device, e.g., transistor, having a first and a second source/drain regions separated by a channel region. A gate may oppose the channel region and be separated therefrom by a gate dielectric. An access line, such as a word line, is electrically connected to the gate of the access device. A DRAM cell can include a storage node, such as a capacitor cell, coupled by the access device to a digit line. The access device can be enabled, e.g., to select the cell, by activating the access line to which its gate is coupled. The capacitor can store a charge corresponding to a data value of a respective cell, e.g., a logic "1" or "0".

DETAILED DESCRIPTION

Figure 1:
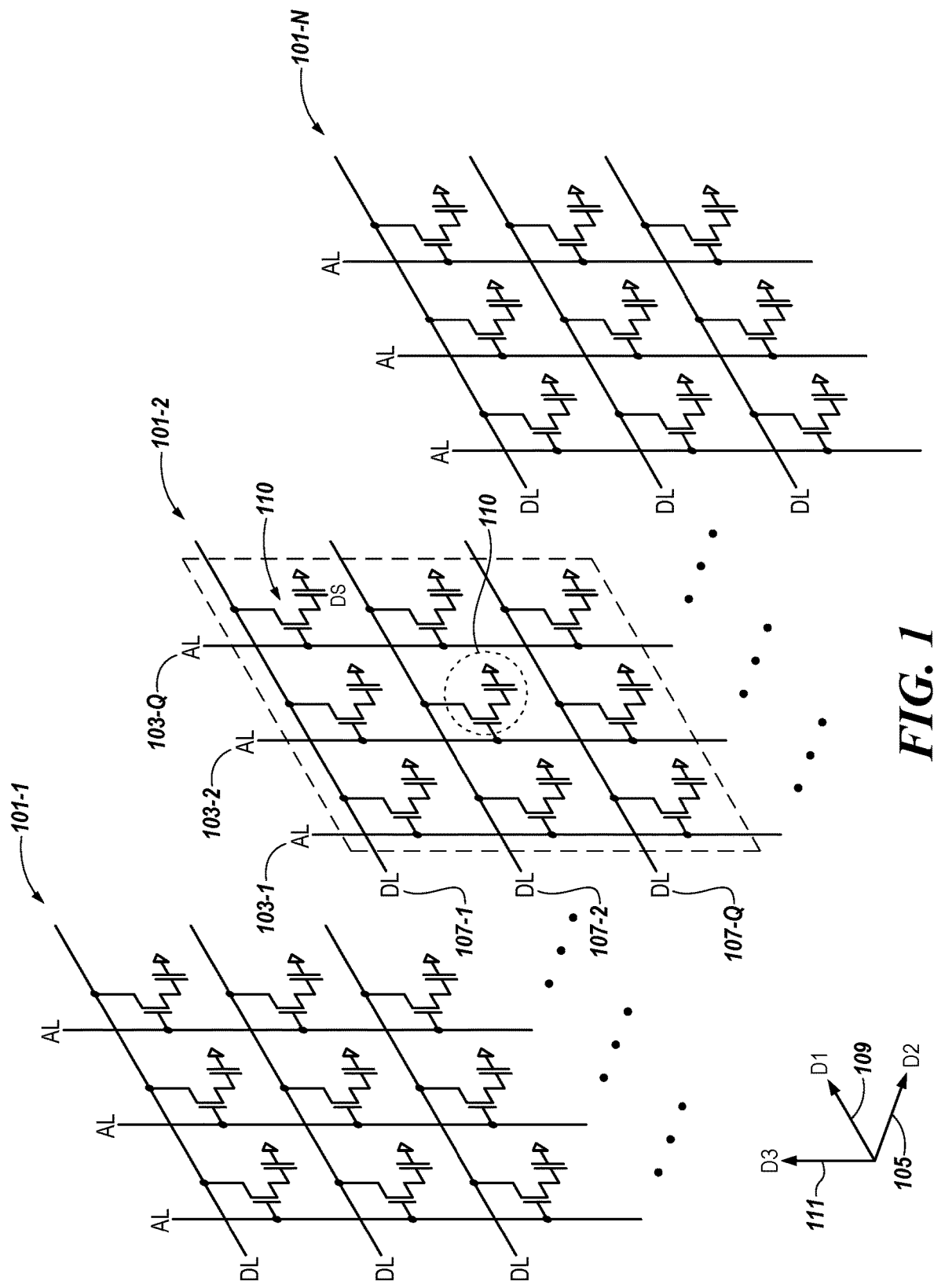
FIG. 1 is a schematic illustration of a vertical three-dimensional (3D) memory in accordance a number of embodiments of the present disclosure.

Embodiments of the present disclosure describe a three-dimensional memory having a vertically oriented access device having a vertical channel. The three-dimensional memory, which may be referred to as a semiconductor device, also includes a horizontally oriented storage node. The vertically oriented access device is vertically adjacent to the horizontally oriented storage node. Utilizing these access devices and storage nodes can help provide an increased width of the access device, as compared to other semiconductor device schemes. Also, utilizing these access devices and storage nodes can help provide a reduced footprint, as compared to other semiconductor device schemes. Providing 3D memory cells in accordance with embodiments described herein can help to provide reduced mobility constraints and/or a reduced operating voltage, as compared to other memory cell schemes.

The figures herein follow a numbering convention in which the first digit or digits correspond to the figure number of the drawing and the remaining digits identify an element or component in the drawing. Similar elements or components between different figures may be identified by the use of similar digits. For example, reference numeral 111 may reference element "11" in FIG. 1, and a similar element may be referenced as 211 in FIG. 2. Multiple analogous elements within one figure may be referenced with a reference numeral followed by a hyphen and another numeral or a letter. For example, 103-1 may reference element 103-1 in FIGS. 1 and 103-2 may reference element 103-2, which may be analogous to element 103-1. Such analogous elements may be generally referenced without the hyphen and extra numeral or letter. For example, elements 103-1 and 103-2 or other analogous elements may be generally referenced as 103. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate the embodiments of the present disclosure and should not be taken in a limiting sense.

FIG. 1 is a schematic illustration of a vertical three-dimensional (3D) memory in accordance a number of embodiments of the present disclosure. FIG. 1 illustrates a circuit diagram showing a cell array of a three-dimensional (3D) semiconductor memory device according to embodiments of the present disclosure. FIG. 1 illustrates a cell array may have a plurality of sub cell arrays 101-1, 101-2, . . . , 101-N. The sub cell arrays 101-1, 101-2, . . . , 101-N may be arranged along a second direction (D2) 105. Each of the sub cell arrays, e.g., sub cell array 101-2, may include a plurality of access lines 103-1, 103-2, . . . , 103-Q (which also may be referred to a word lines). Also, each of the sub cell arrays, e.g., sub cell array 101-2, may include a plurality of digit lines 107-1, 107-2, . . . , 107-P (which also may be referred to as bit lines, data lines, or sense lines). In FIG. 1, the digit lines 107-1, 107-2, . . . , 107-P are illustrated extending in a first direction (D1) 109 and the access lines 103-1, 103-2, . . . , 103-Q are illustrated extending in a third direction (D3) 111. According to embodiments, the first direction (D1) 109 and the second direction (D2) 105 may be considered in a horizontal ("X-Y") plane. The third direction (D3) 111 may be considered in a vertical ("Z") plane. Hence, according to embodiments described herein, the access lines 103-1, 103-2, . . . , 103-Q are extending in a vertical direction, e.g., third direction (D3) 111.

A memory cell, e.g., 110, may include an access device, e.g., access transistor, and a storage node located at an intersection of each access line 103-1, 103-2, . . . , 103-Q and each digit line 107-1, 107-2, . . . , 107-P. Memory cells may be written to, or read from, using the access lines 103-1, 103-2, . . . , 103-Q and digit lines 107-1, 107-2, . . . , 107-P. The digit lines 107-1, 107-2, . . . , 107-P may conductively interconnect memory cells along horizontal columns of each sub cell array 101-, 101-2, ..., 101-N, and the access lines 103-1, 103-2, ..., 103-Q may conductively interconnect memory cells along vertical rows of each sub cell array 101-, 101-2, ..., 101-N. One memory cell, e.g. 110, may be located between one access line, e.g., 103-2, and one digit line, e.g., 107-2. Each memory cell may be uniquely addressed through a combination of an access line 103-1, 103-2, ..., 103-Q and a digit line 107-1, 107-2, ..., 107-P.

The digit lines 107-1, 107-2, ..., 107-P may be or include conducting patterns, e.g., metal lines, disposed on and spaced apart from a substrate. The digit lines 107-1, 107-2, ..., 107-P may extend in a first direction (D1) 109. The digit lines 107-1, 107-2, ..., 107-P in one sub cell array, e.g., 101-2, may be spaced apart from each other in a vertical direction, e.g., in a third direction (D3) 111.

The access lines 103-1, 103-2, ..., 103-Q may be or include conductive patterns, e.g., metal lines, extending in a vertical direction with respect to the substrate, e.g., in a third direction (D3) 111. The access lines in one sub cell array, e.g., 101-2, may be spaced apart from each other in the first direction (D1) 109.

A gate of a memory cell, e.g., memory cell 110, may be connected to an access line, e.g., 103-2, and a first conductive node, e.g., first source/drain region, of an access device, e.g., transistor, of the memory cell 110 may be connected to a digit line, e.g., 107-2. Each of the memory cells, e.g., memory cell 110, may be connected to a storage node, e.g., capacitor. A second conductive node, e.g., second source/drain region, of the access device, e.g., transistor, of the memory cell 110 may be connected to the storage node, e.g., capacitor. While first and second source/drain region reference are used herein to denote two separate and distinct source/drain regions, it is not intended that the source/drain region referred to as the "first" and/or "second" source/drain regions have some unique meaning. It is intended only that one of the source/drain regions is connected to a digit line, e.g., 107-2, and the other may be connected to a storage node.

Figure 2:
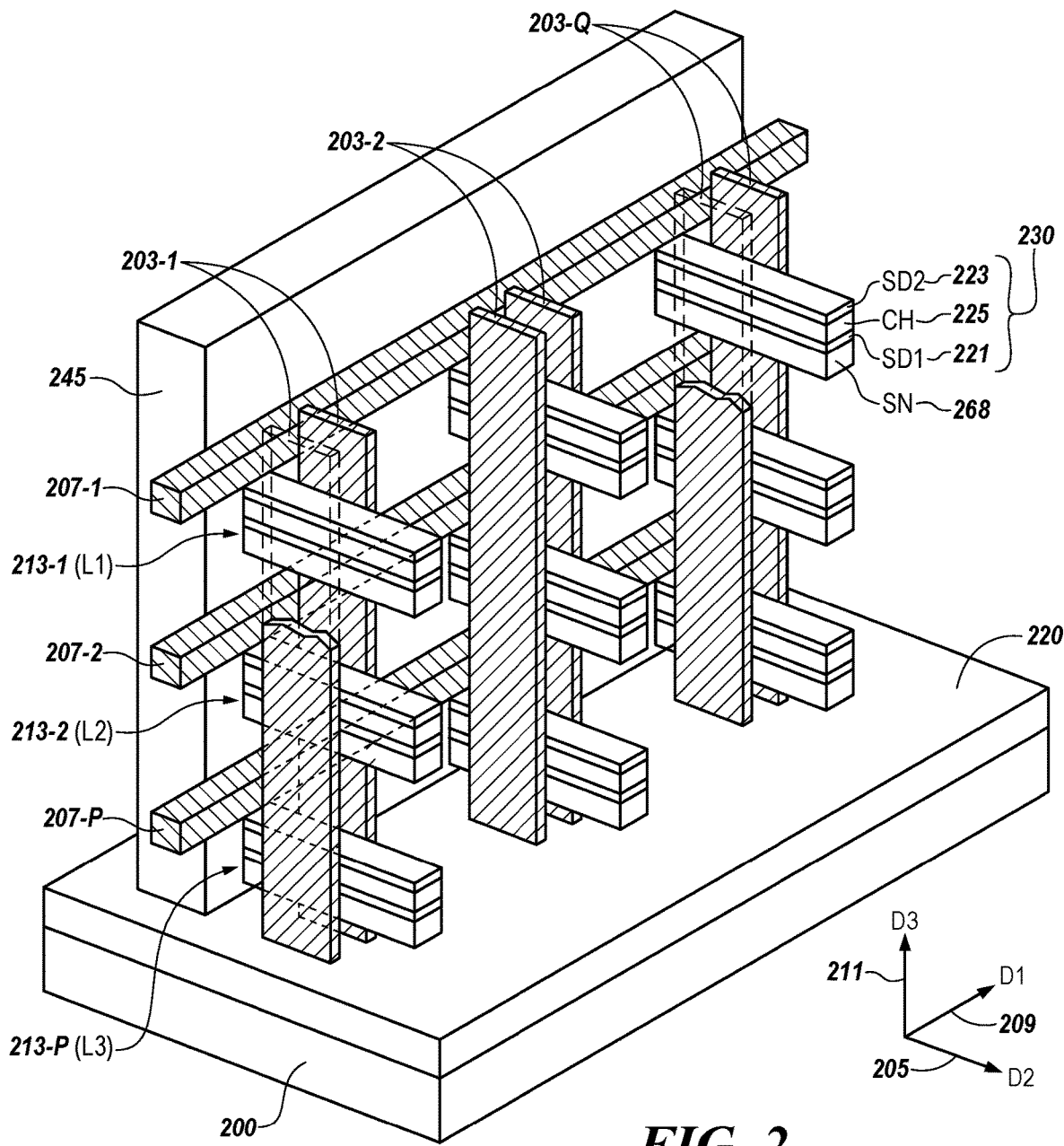
FIG. 2 is a perspective view illustrating a portion of a semiconductor devices in accordance with a number of embodiments of the present disclosure.

FIG. 2 is a perspective view illustrating a portion of a semiconductor device in accordance with a number of embodiments of the present disclosure. FIG. 2 illustrates a perspective view showing a three dimensional (3D) semiconductor memory device, e.g., a portion of a sub cell array 101-2 shown in FIG. 1 as a vertically oriented stack of memory cells in an array, according to some embodiments of the present disclosure.

As shown in FIG. 2, a substrate 200 may have formed thereon one of the plurality of sub cell arrays, e.g., 101-2, described in connection with FIG. 1. For example, the substrate 200 may be or include a silicon substrate, a germanium substrate, or a silicon-germanium substrate, etc. Embodiments, however, are not limited to these examples.

As shown in the example embodiment of FIG. 2, the substrate 200 may have fabricated thereon a vertically oriented stack of memory cells, e.g., memory cell 110 in FIG. 1, extending in a vertical direction, e.g., third direction (D3) 211. According to some embodiments the vertically oriented stack of memory cells may be fabricated such that each memory cell, e.g., memory cell 110 in FIG. 1, is formed on plurality of vertical levels, e.g., a first level (L1), a second level (L2), and a third level (L3). The repeating, vertical levels, L1, L2, and L3, may be arranged, e.g., "stacked", a vertical direction, e.g., third direction (D3) 111 shown in FIG. 1, and may be separated from the substrate 200 by an insulator material 220. Each of the repeating, vertical levels, L1, L2, and L3 may include a plurality of discrete components, e.g., regions, to the vertically oriented access devices 230, e.g., transistors, and storage nodes, e.g., capacitors, including access line 203-1, 203-2, ..., 203-Q connections and digit line 207-1, 207-2, ..., 207-P connections. The plurality of discrete components to the vertically oriented access devices 230, e.g., transistors, may be formed in a plurality of iterations of vertically, repeating layers within each level and may extend horizontally in the second direction (D2) 205, analogous to second direction (D2) 105 shown in FIG. 1.

The plurality of discrete components to the vertically oriented access devices 230, e.g., transistors, may include a first source/drain region 221 and a second source/drain region 223 separated by a channel region 225. As shown in FIG. 2, the storage nodes 268 are vertically adjacent to the vertically oriented access devices 230. In some embodiments, the channel region 225 may include a channel material, such as silicon, germanium, silicon-germanium, and/or indium gallium zinc oxide (IGZO). The channel region 225 may include a two-dimensional (2D) material. The 2D material may comprise any suitable composition; and in some embodiments may include one or more of a transition metal dichalcogenide, including molybdenum disulfide ($MoS_2$), molybdenum diselenide ($MoSe_2$), molybdenum ditelluride ($MoTe_2$), tungsten sulfide ($WS_2$), and tungsten selenide ($WSe_2$). Embodiments, however, are not limited to these examples. In some embodiments, the first and the second source/drain regions, 221 and 223, can include an n-type dopant region formed in a p-type doped body to the access device to form an n-type conductivity transistor. In some embodiments, the first and the second source/drain regions, 221 and 223, may include a p-type dopant formed within an n-type doped body to the access device to form a p-type conductivity transistor. By way of example, and not by way of limitation, the n-type dopant may include phosphorous (P) atoms and the p-type dopant may include boron (B) atoms formed in an oppositely doped body region of polysilicon semiconductor material. Embodiments, however, are not limited to these examples. The first and the second source/drain regions, 221 and 223, may comprise a metal, and/or metal composite materials containing ruthenium (Ru), molybdenum (Mo), nickel (Ni), titanium (Ti), copper (Cu), a highly doped degenerate semiconductor material, and/or at least one of indium oxide ($In_2O_3$), or indium tin oxide ($In_{2-x}Sn_xO_3$), formed using an atomic layer deposition process, etc. Embodiments, however, are not limited to these examples.

The storage node 268, e.g., capacitor, may be connected to one respective source/drain region of the access device. As shown in FIG. 2, the storage node 268, e.g., capacitor, may be connected to the second source/drain region 223 of the access device. The storage node may be or include memory elements capable of storing data. Each of the storage nodes may be a memory element using one of a capacitor, a magnetic tunnel junction pattern, and/or a variable resistance body which includes a phase change material, etc. A number of embodiments provide that the storage node is a metal-insulator-metal (MIM) or a metal-ferroelectric-metal (MFM) capacitor. A number of embodiments provide that the storage node has a folded architecture.

As shown in FIG. 2 a plurality of horizontally oriented digit lines 207-1, 207-2, ..., 207-P extend in the first direction (D1) 209. The plurality of horizontally oriented digit lines 207-1, 207-2, ..., 207-P may be arranged, e.g., "stacked", along the third direction (D3) 211. The plurality of horizontally oriented digit lines 207-1, 207-2, ..., 207-P may include a conductive material. For example, the conductive material may include one or more of a doped semiconductor, e.g., doped silicon, doped germanium, etc., a conductive metal nitride, e.g., titanium nitride, tantalum nitride, etc., a metal, e.g., tungsten (W), titanium (Ti), tantalum (Ta), ruthenium (Ru), cobalt (Co), molybdenum (Mo), etc., and/or a metal-semiconductor compound, e.g., tungsten silicide, cobalt silicide, titanium silicide, etc. Embodiments, however, are not limited to these examples.

Among each of the vertical levels, (L1) 213-1, (L2) 213-2, and (L3) 213-P, the vertically oriented memory cells, e.g., memory cell 110 in FIG. 1, may be spaced apart from one another horizontally in the first direction (D1) 209. As described in more detail below in connection with FIGS. 3A-3P, the plurality of discrete components to the vertically oriented access devices 230, e.g., first source/drain region 221 and second source/drain region 223 separated by a channel region 225, and the plurality of horizontally oriented digit lines 207-1, 207-2, . . . , 207-P, may be formed within different vertical layers within each level. For example, the plurality of horizontally oriented digit lines 207-1, 207-2, . . . , 207-P, extending in the first direction (D1) 209, may be disposed on, and in electrical contact with, top surfaces of first source/drain regions 221 of the vertically oriented access devices 230. In some embodiments, the plurality of horizontally oriented digit lines 207-1, 207-2, . . . , 207-P, extending in the first direction (D1) 209, may be connected to the top surfaces of the first source/drain regions 221 of the vertically oriented access device 230 directly and/or through additional contacts, such as metal silicides, for instance.

As shown in the example embodiment of FIG. 2, the access lines, 203-1, 203-2, . . . , 203-Q, extend in a vertical direction with respect to the substrate 200, e.g., in a third direction (D3) 211. Further, as shown in FIG. 2, the access lines, 203-1, 203-2, . . . , 203-Q, in one sub cell array, e.g., sub cell array 101-2 in FIG. 1, may be spaced apart from each other in the first direction (D1) 209. The access lines, 203-1, 203-2, . . . , 203-Q, may be provided, extending vertically relative to the substrate 200 in the third direction (D3) 211 between a pair of the vertically oriented access devices 230, but adjacent to each other on a level, e.g., first level (L1), in the first direction (D1) 209. Each of the access lines, 203-1, 203-2, . . . , 203-Q, may vertically extend, in the third direction (D3), on sidewalls of respective ones of the plurality of vertically oriented access devices 230, that are vertically stacked.

For example, and as shown in FIG. 2, a first one of the vertically extending access lines, e.g., 203-1, may be adjacent a sidewall of a channel region 225 to a first one of the vertically oriented access device 230, in the first level (L1) 213-1, a sidewall of a channel region 225 of a first one of the vertically oriented access devices 230 in the second level (L2) 213-2, and a sidewall of a channel region 225 a first one of the vertically oriented access devices 230 in the third level (L3) 213-P, etc. Similarly, a second one of the vertically extending access lines, e.g., 203-2, may be adjacent a sidewall to a channel region 225 of a second one of the vertically oriented access devices 230 in the first level (L1) 213-1, spaced apart from the first one of vertically oriented access devices 230 in the first level (L1) 213-1 in the first direction (D1) 209. And the second one of the vertically extending access lines, e.g., 203-2, may be adjacent a sidewall of a channel region 225 of a second one of the vertically oriented access devices 230 in the second level (L2) 213-2, and a sidewall of a channel region 225 of a second one of the vertically oriented access devices 230 in the third level (L3) 213-P, etc. Embodiments are not limited to a particular number of levels.

The vertically extending access lines, 203-1, 203-2, . . . , 203-Q, may include a conductive material, such as, for example, a doped semiconductor material, a conductive metal nitride, metal, and/or a metal-semiconductor compound. The access lines, 203-1, 203-2, . . . , 203-Q, may correspond to wordlines (WL), e.g., as described in connection with FIG. 1.

As shown in the example embodiment of FIG. 2, a conductive body contact 245 may be formed extending in the first direction (D1) 209 along an end surface of the vertically oriented access devices 230 in each level (L1) 213-1, (L2) 213-2, and (L3) 213-P above the substrate 200. The body contact 245 may be connected to a respective portion of the vertically oriented access devices 230. The body contact 245 may include a conductive material such as, for example, one of a doped semiconductor material, a conductive metal nitride, metal, and/or a metal-semiconductor compound.

Although not shown in FIG. 2, an insulating material may fill other spaces in the vertically stacked array of memory cells. For example, the insulating material may include one or more of a silicon oxide material, a silicon nitride material, and/or a silicon oxynitride material, etc. Embodiments, however, are not limited to these examples.

Figure 3A:
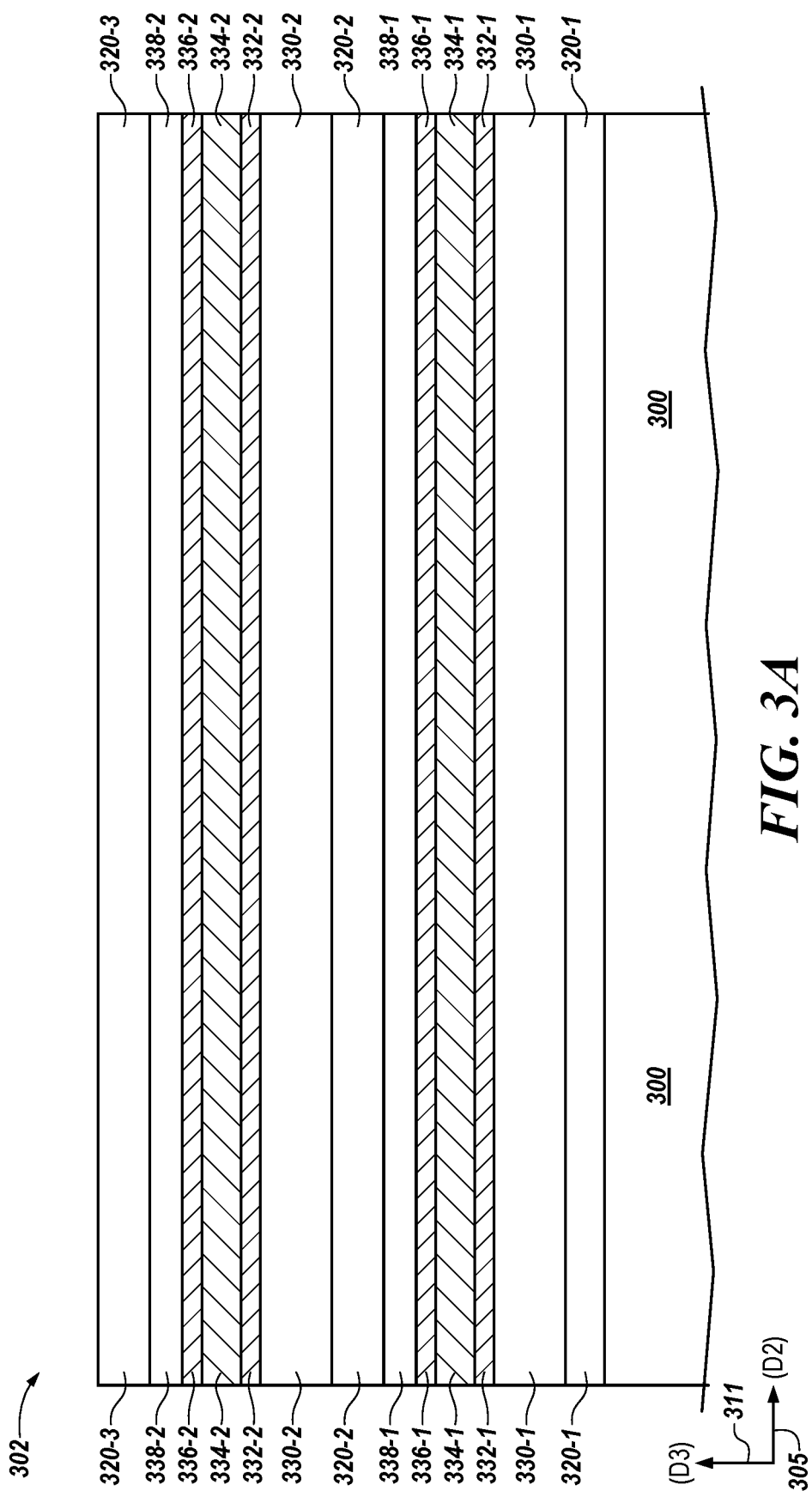
FIG. 3A-3V illustrate portions of vertically stacked memory cells, at various stages of a fabrication process, in accordance with a number of embodiments of the present disclosure.
Figure 3B:
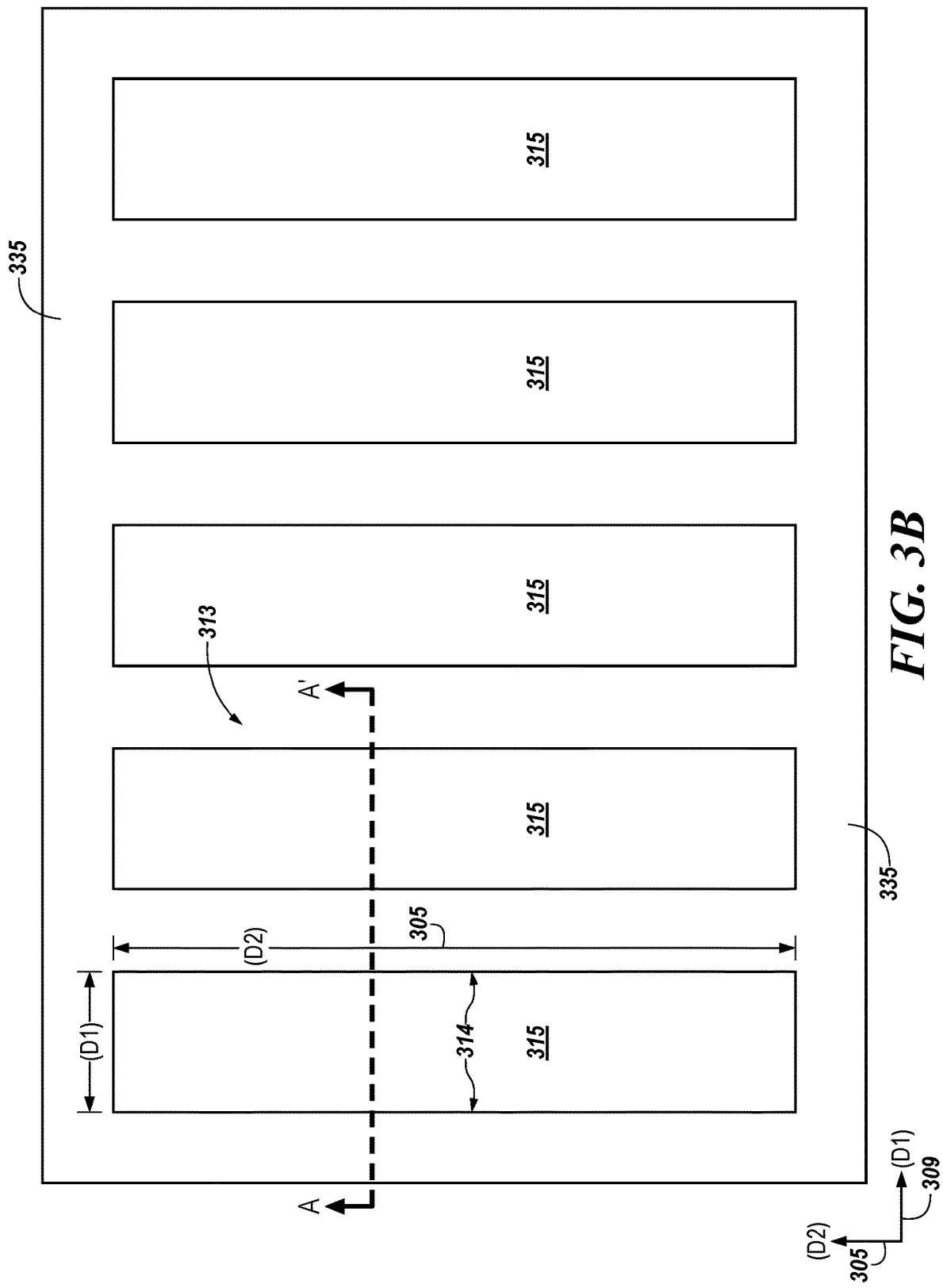
Figure 3E:
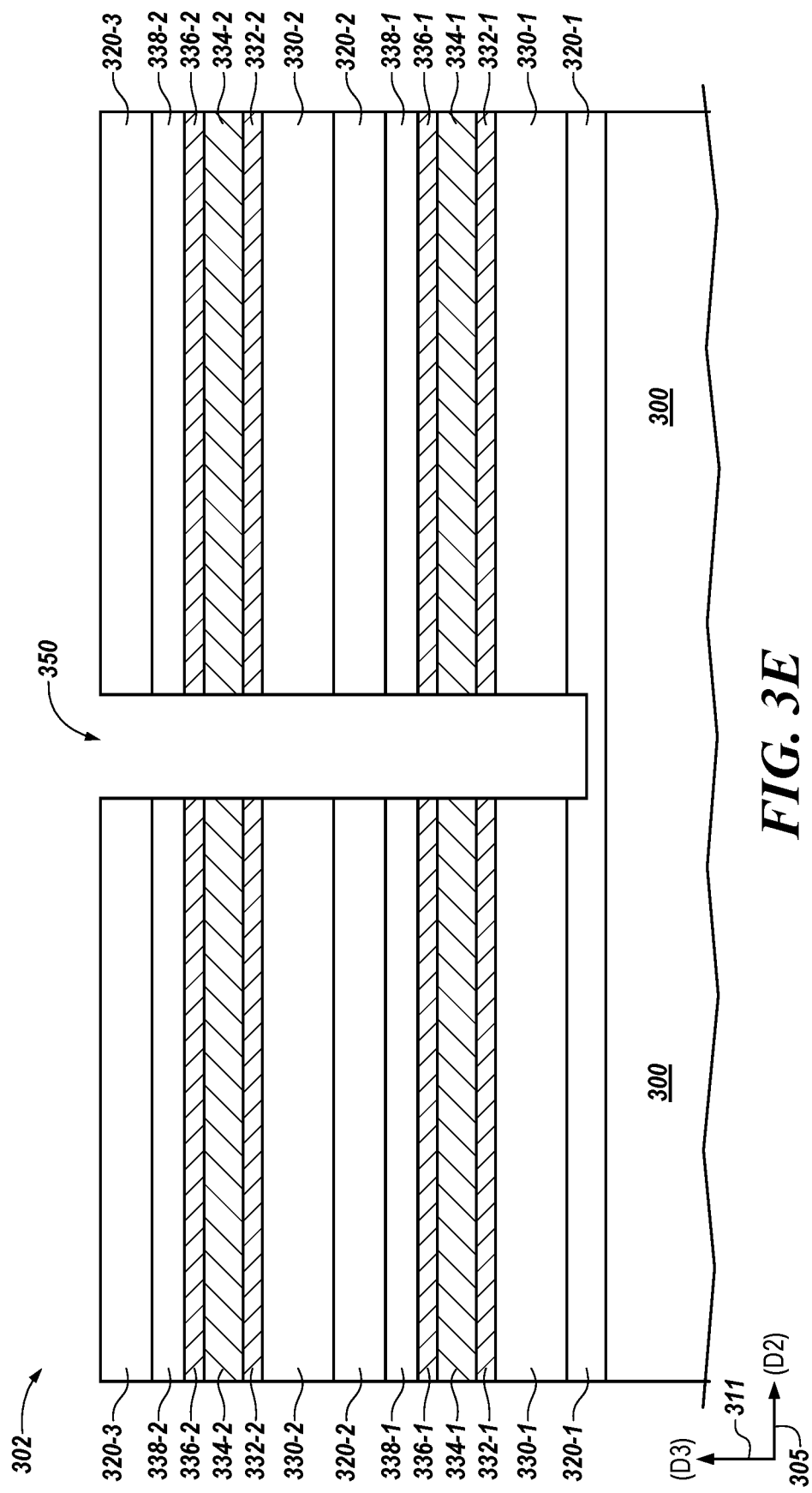
Figure 3F:
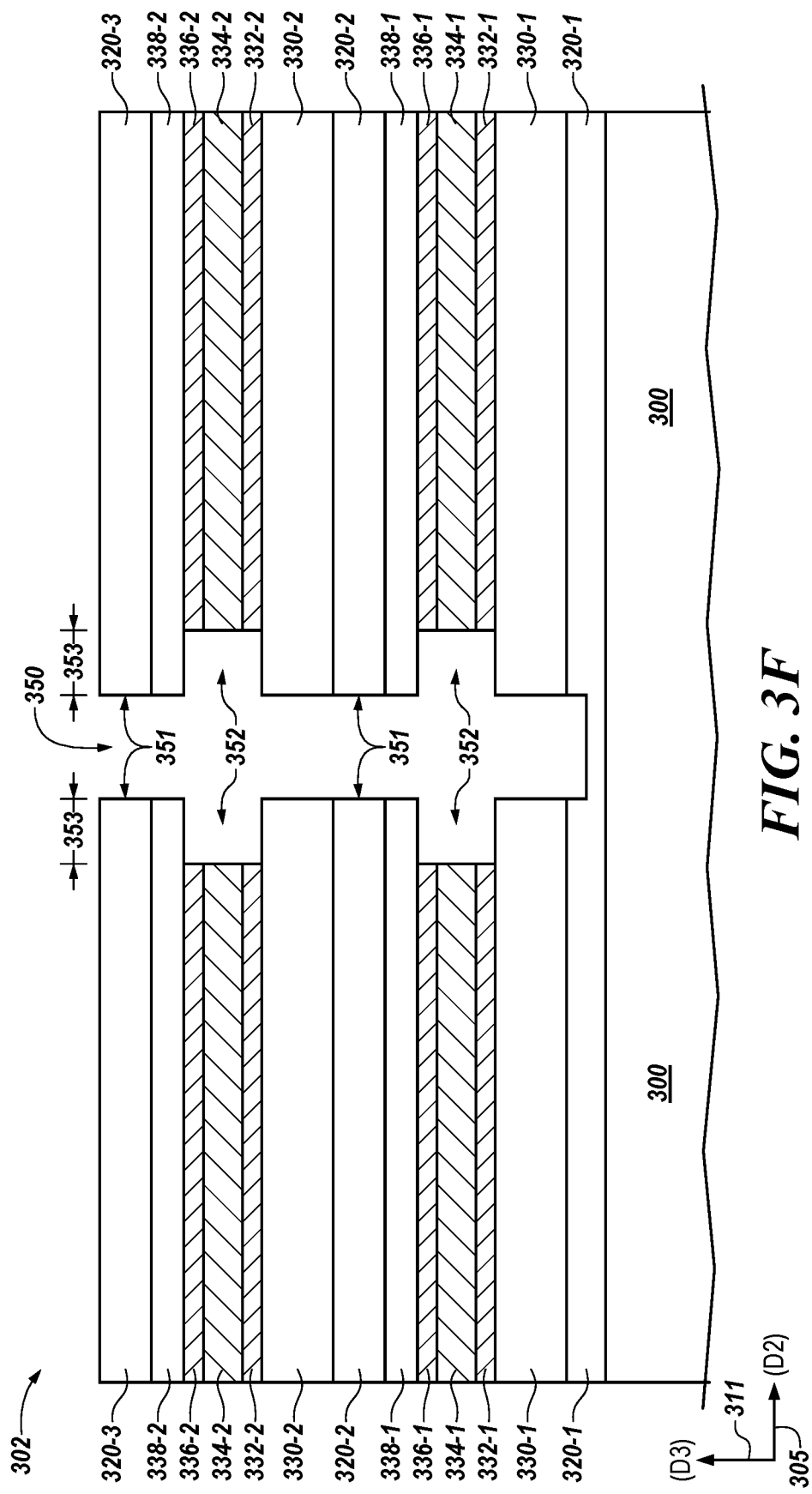
Figure 3G:
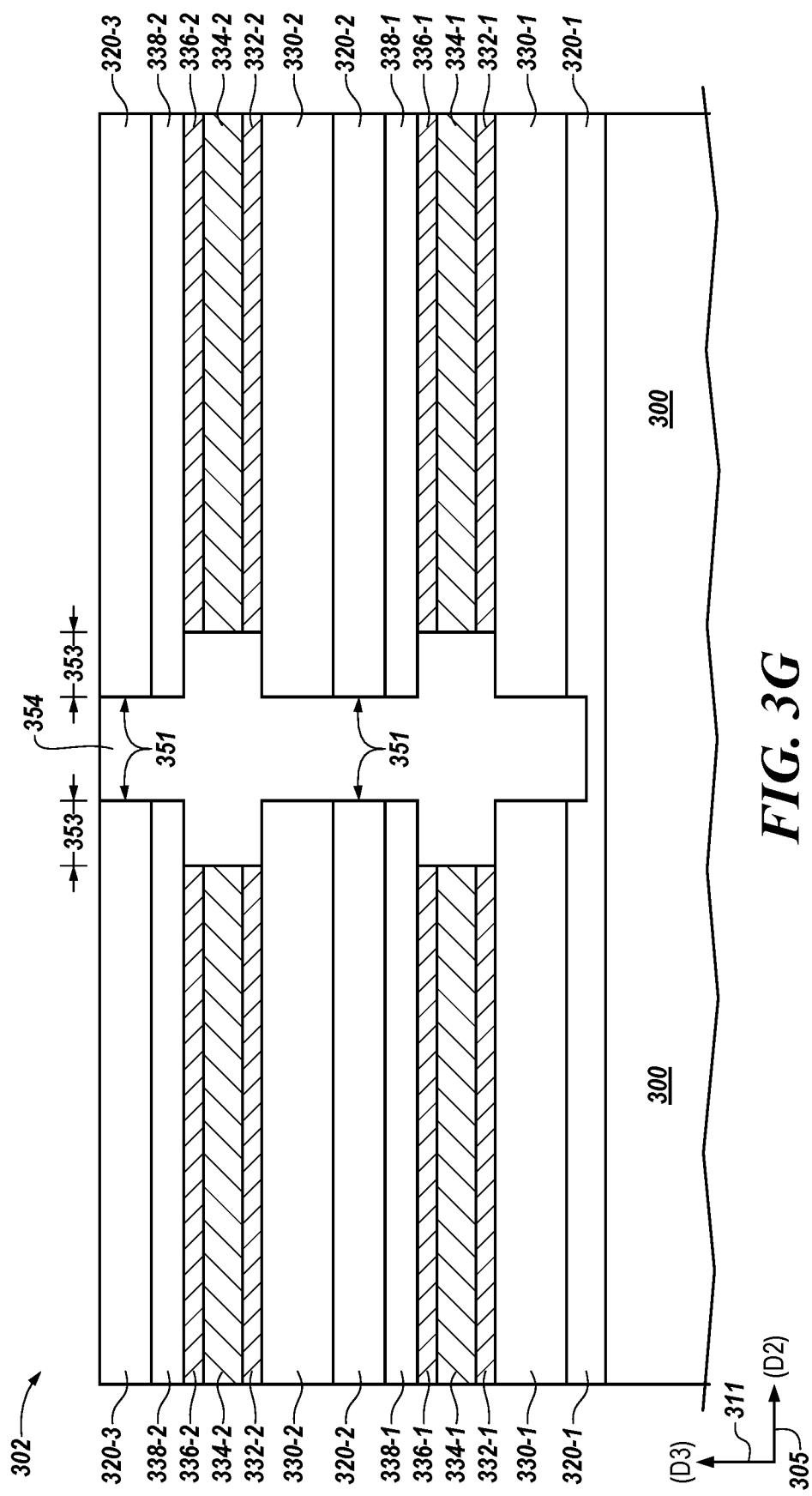
Figure 3H:
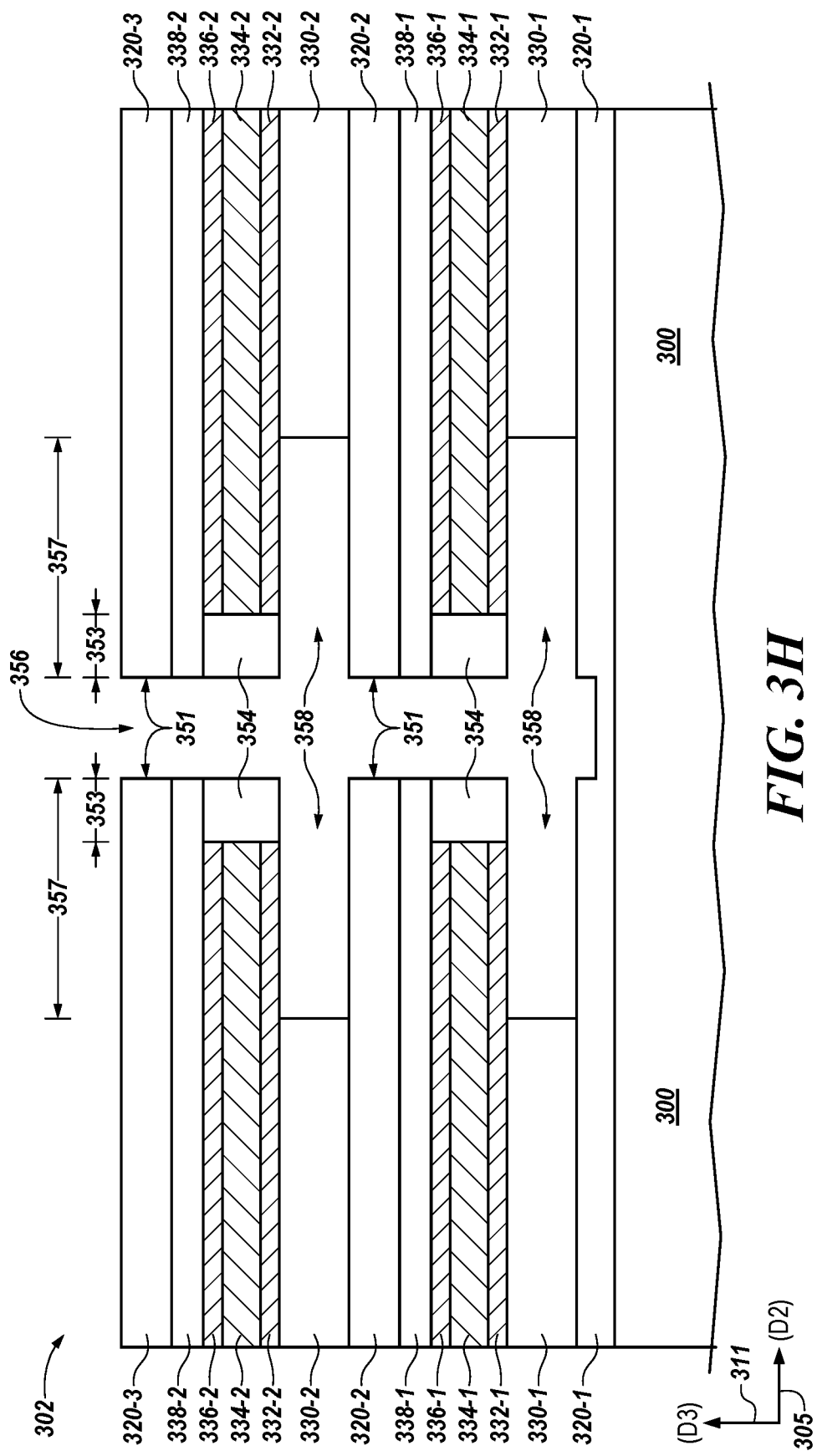
Figure 3I:
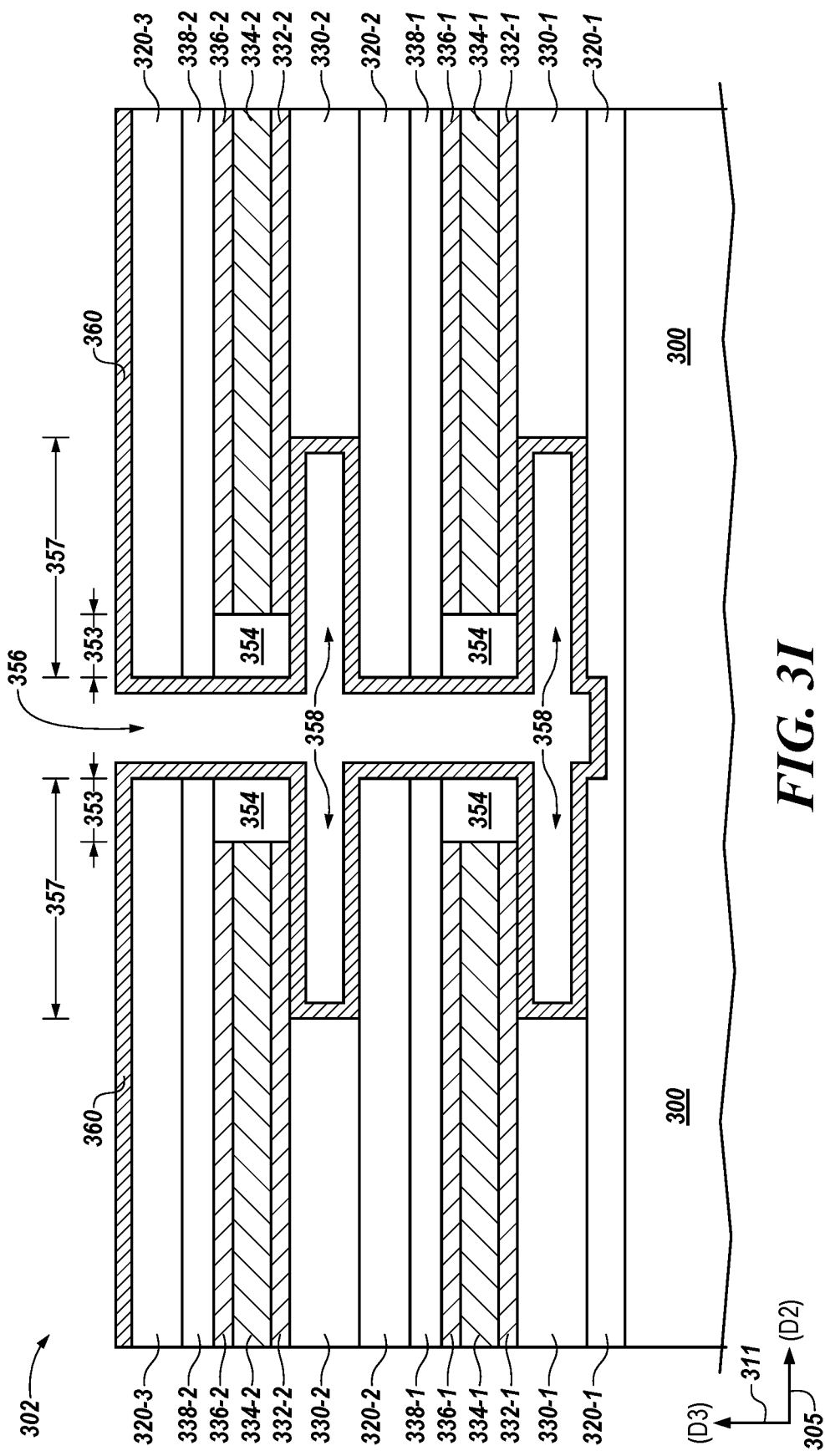
Figure 3J:
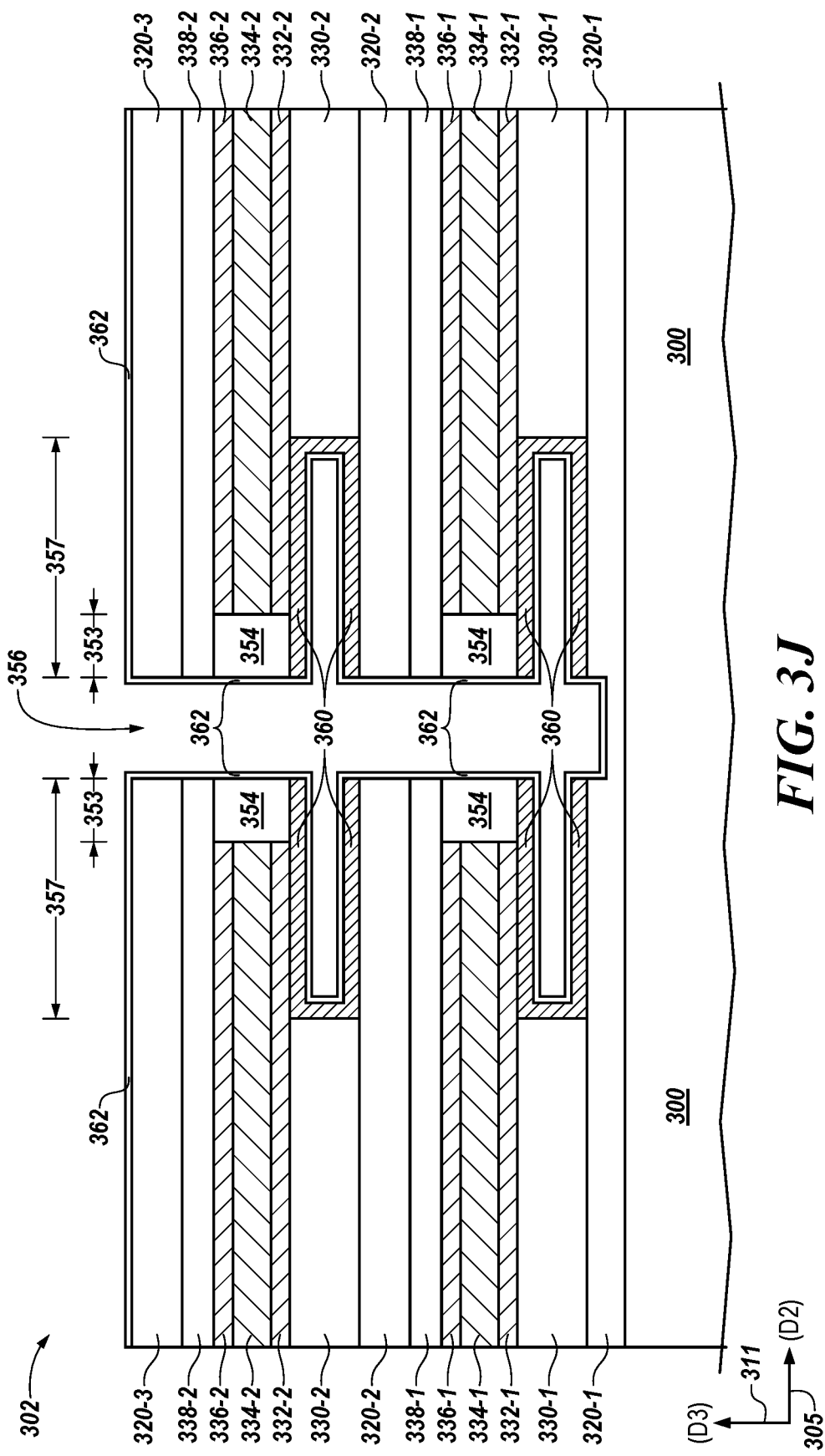
Figure 3K:
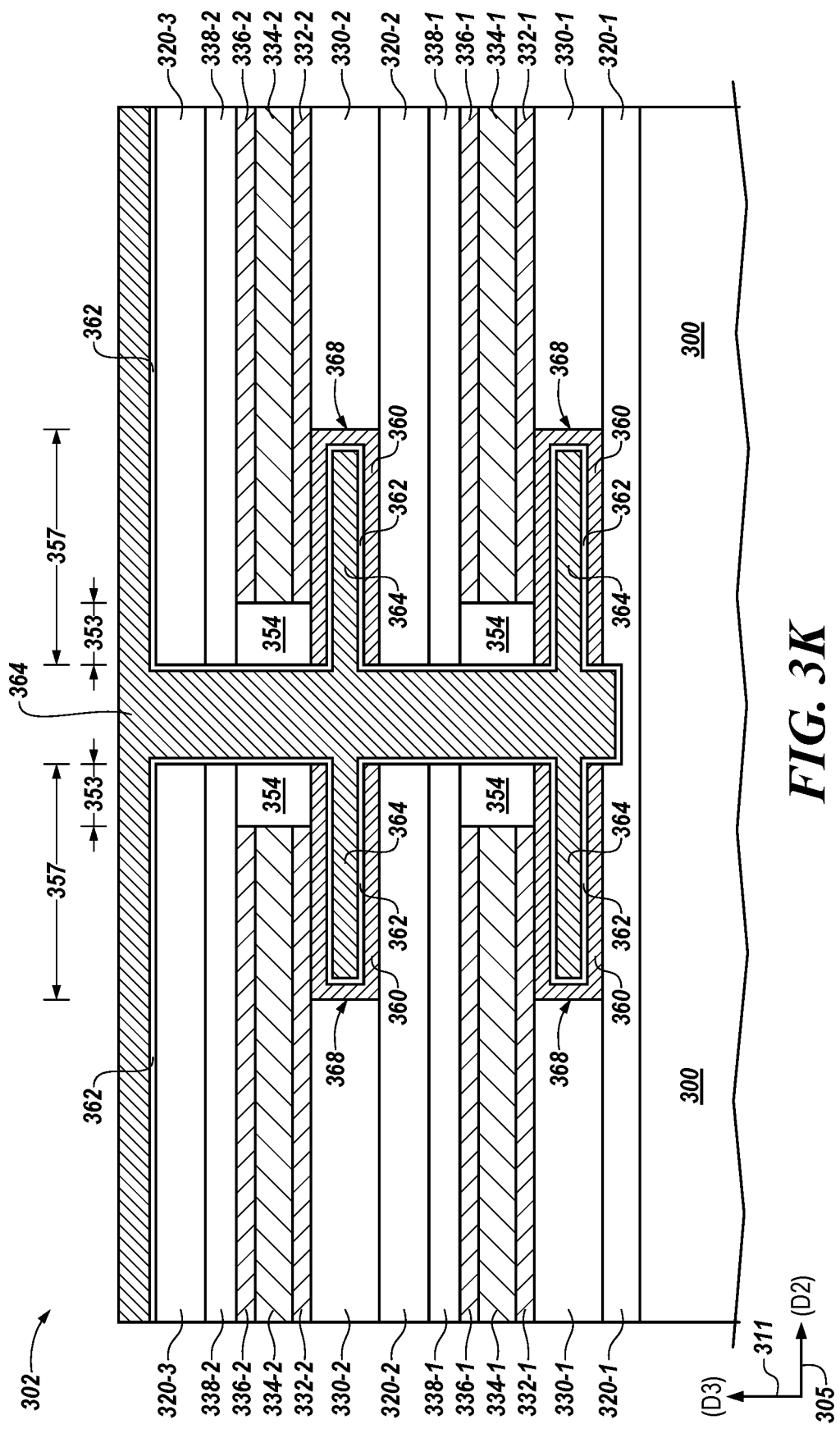
Figure 3L:
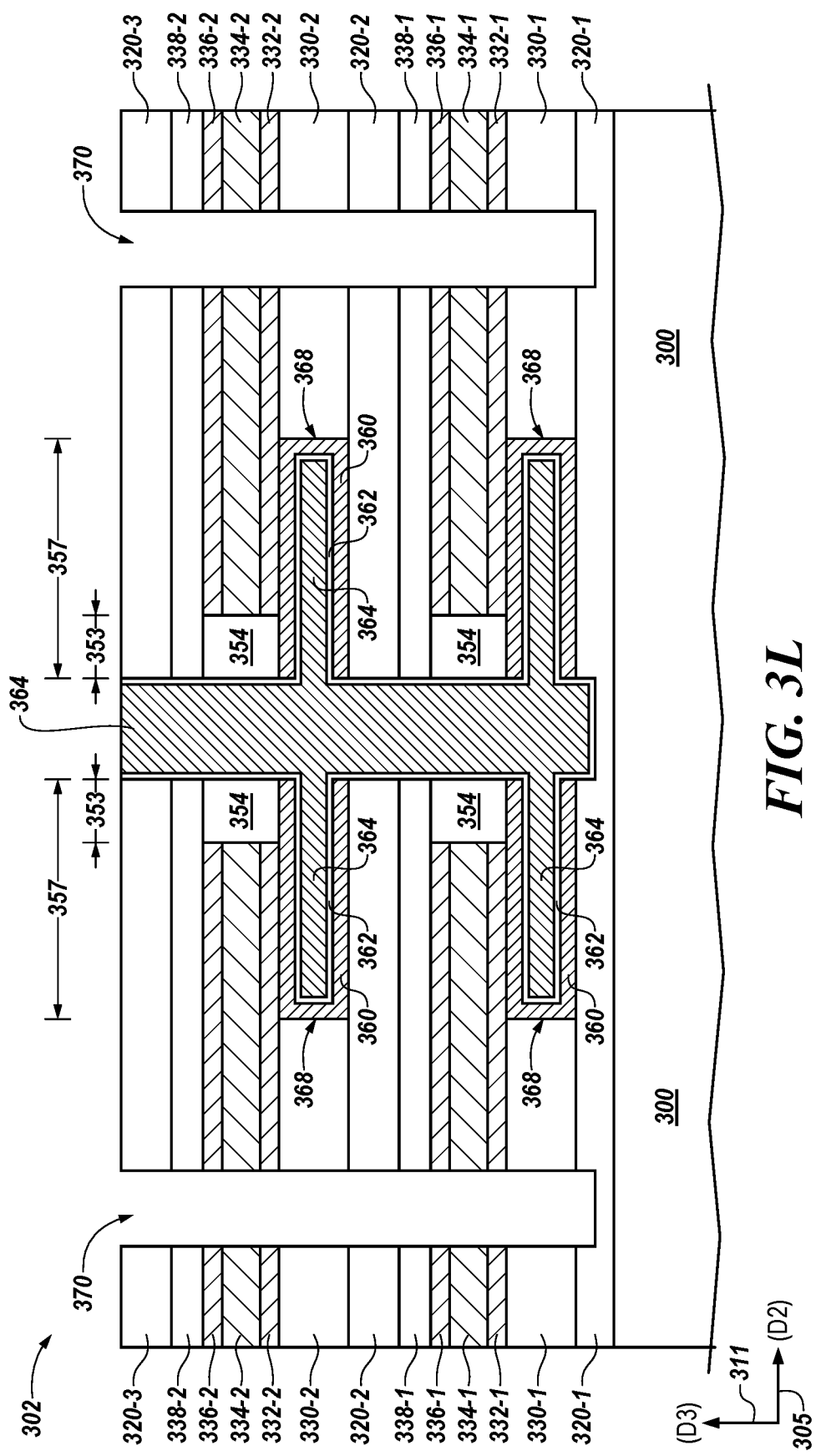
Figure 3M:
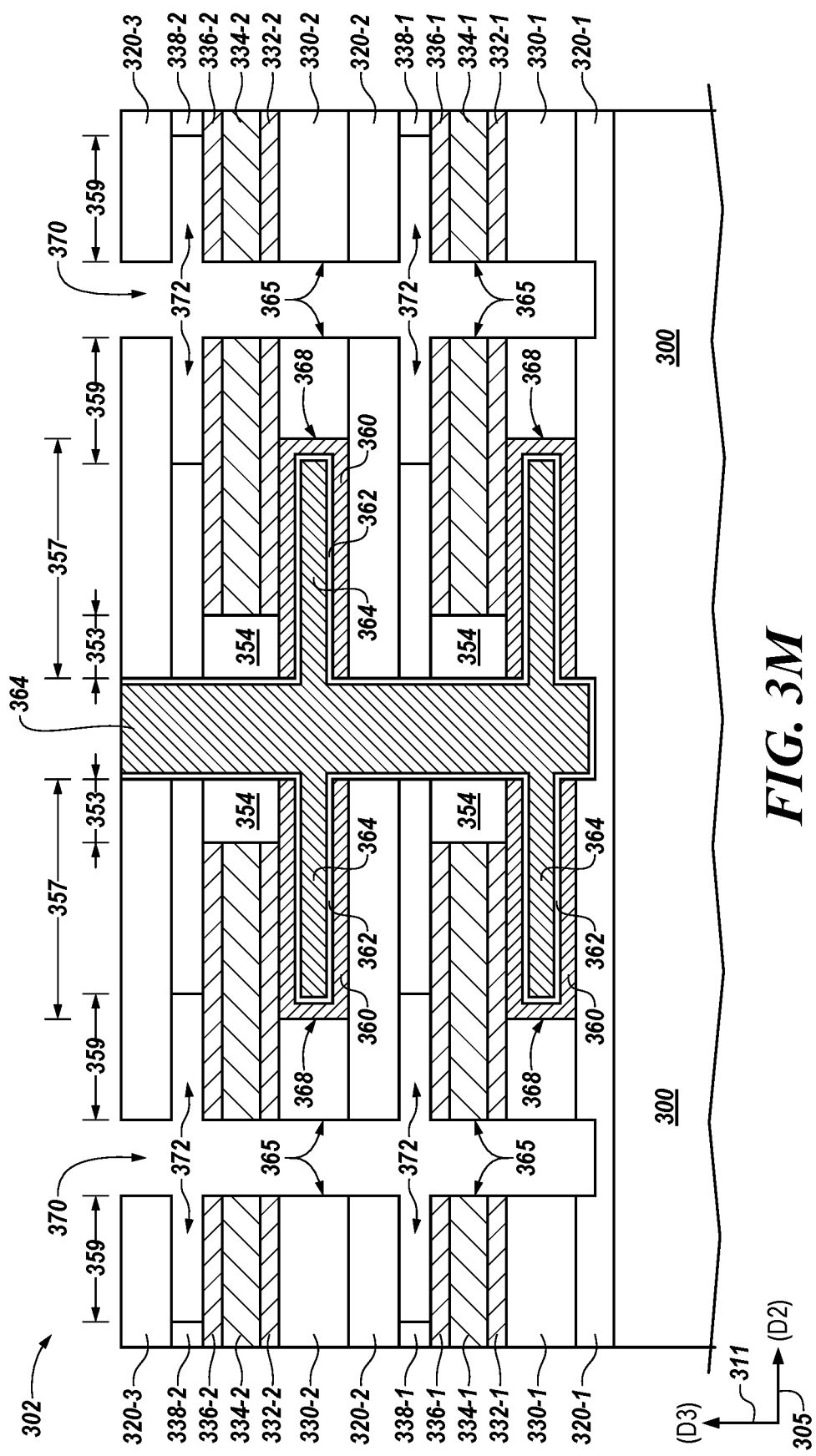
Figure 3N:
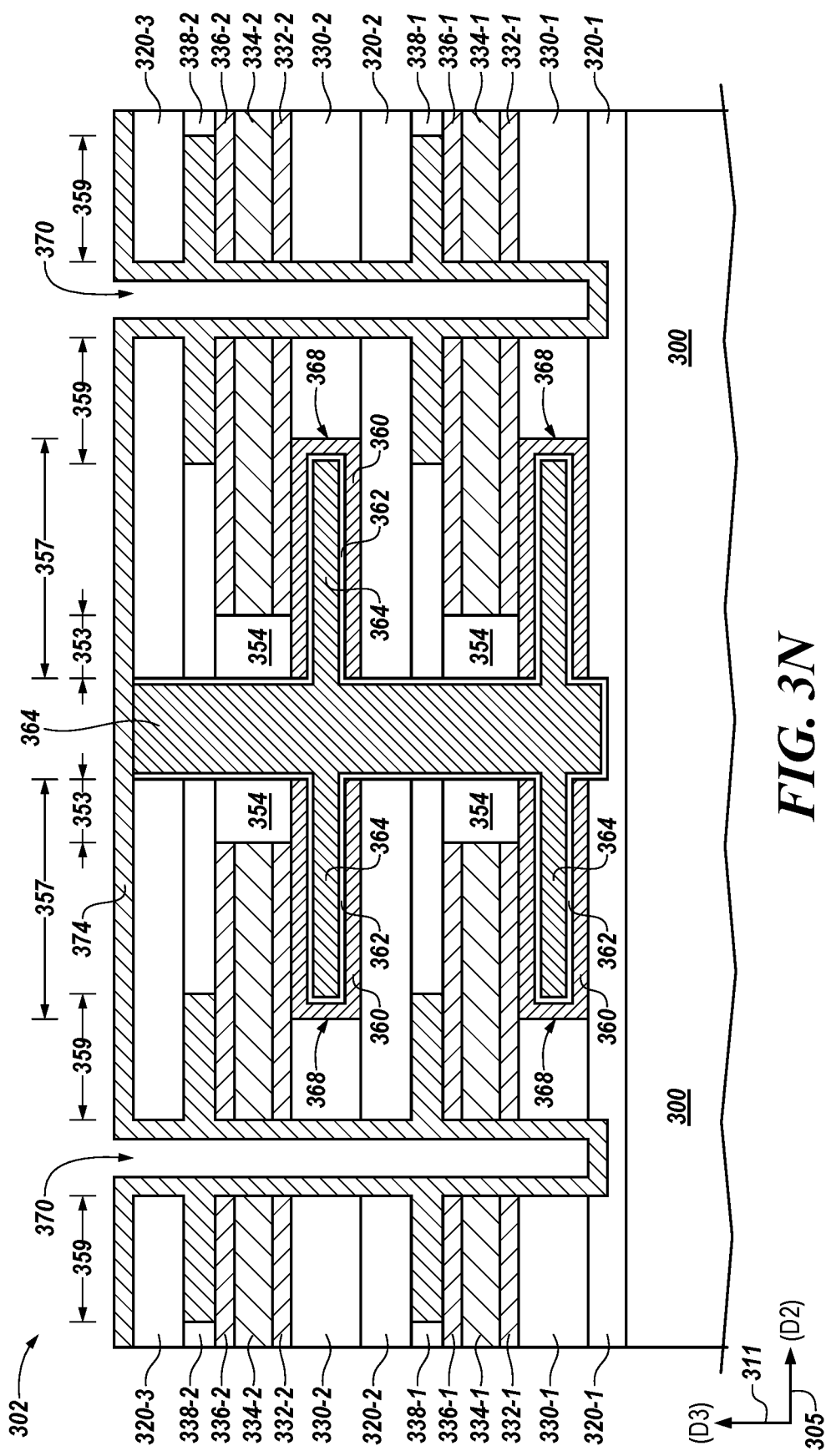
Figure 30:
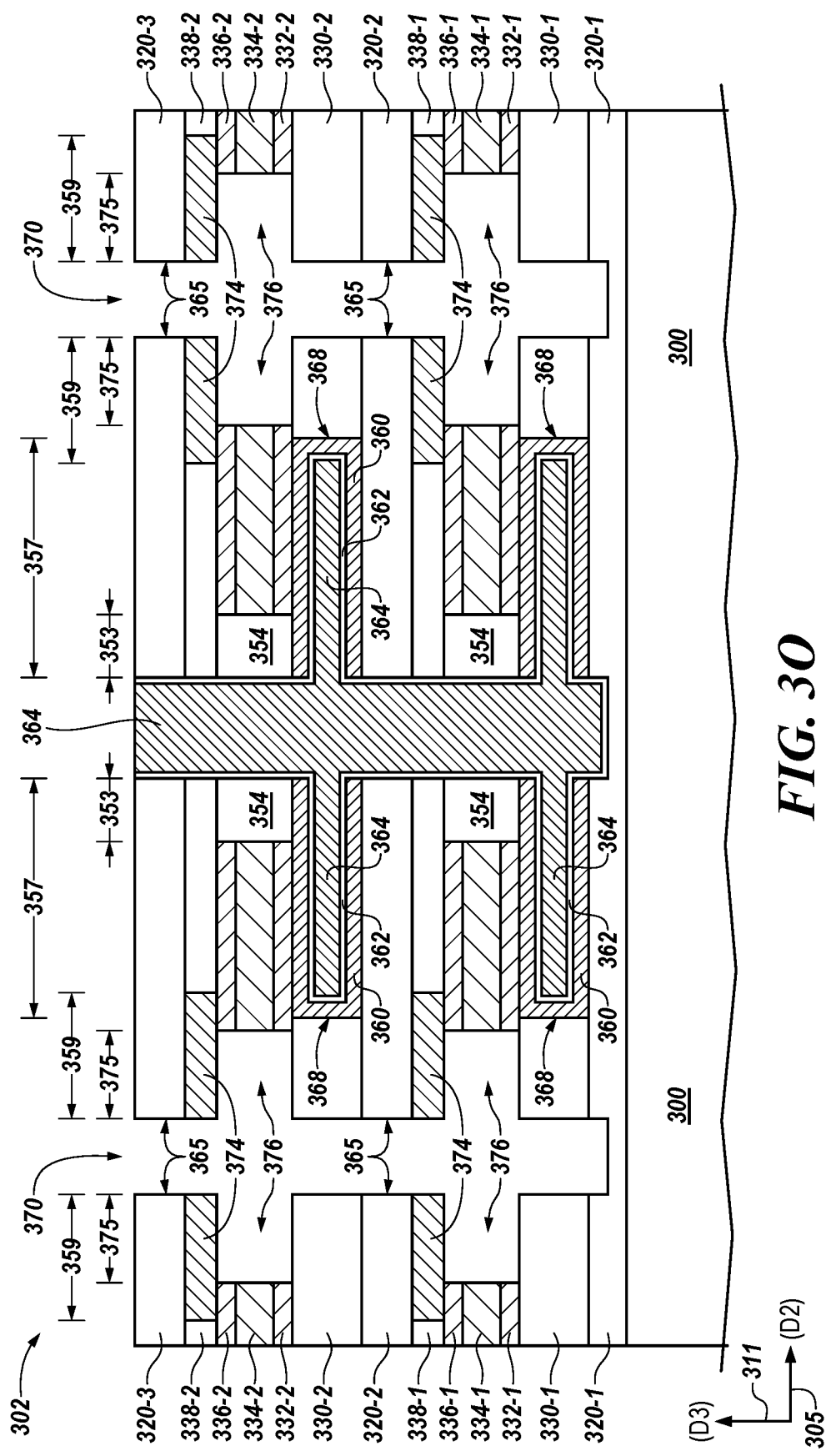
Figure 3P:
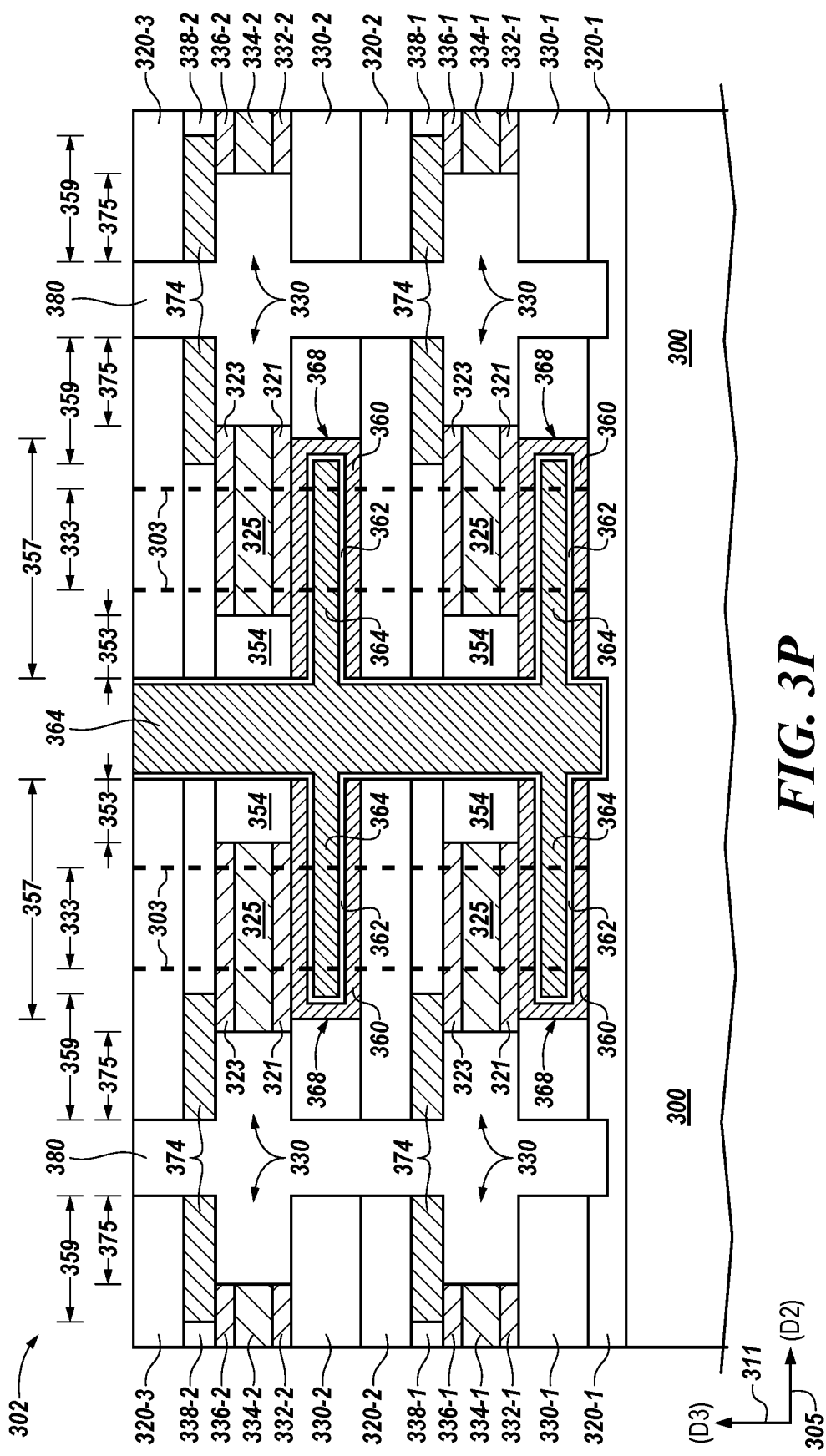
Figure 3Q:
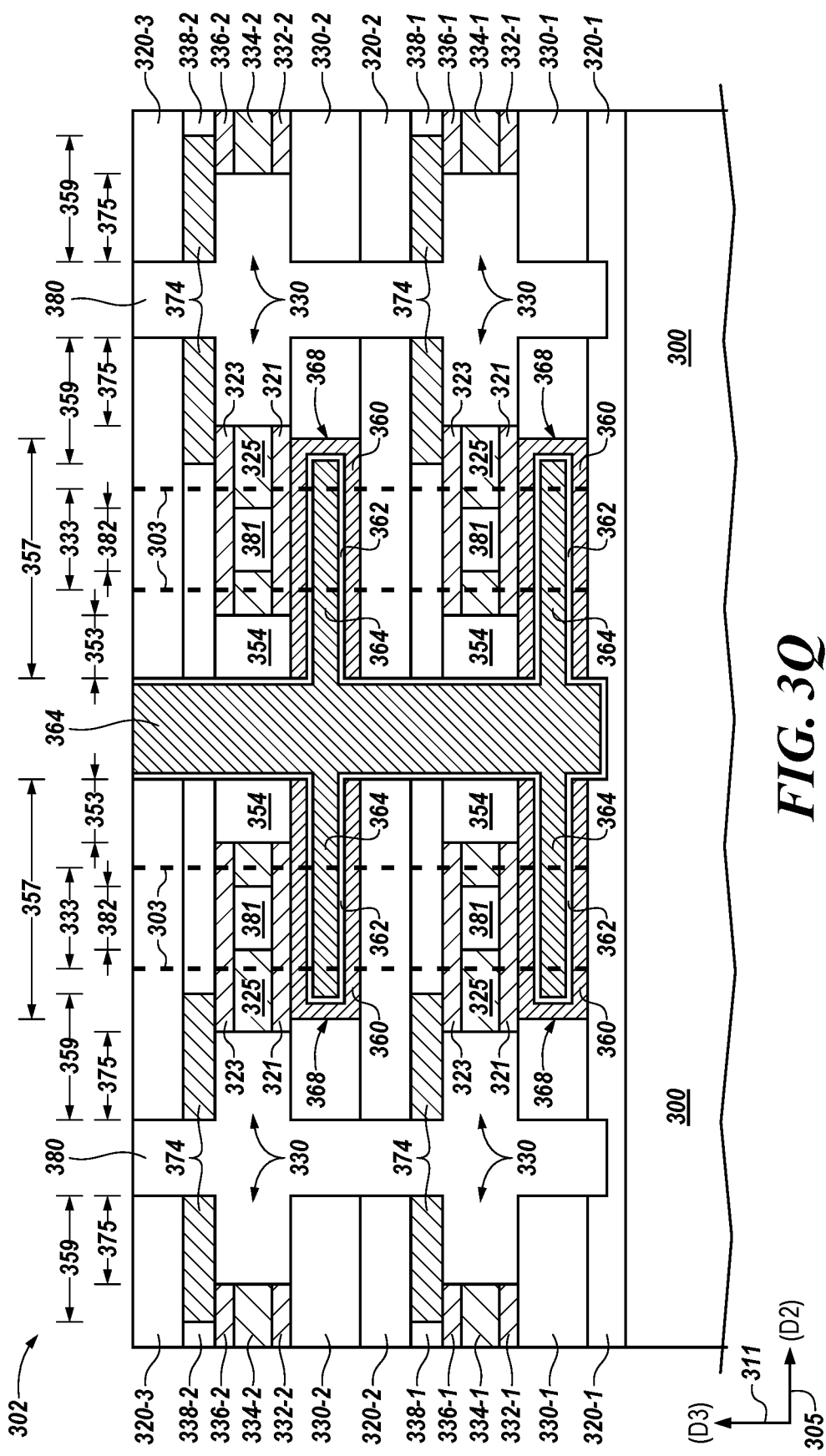
Figure 3R:
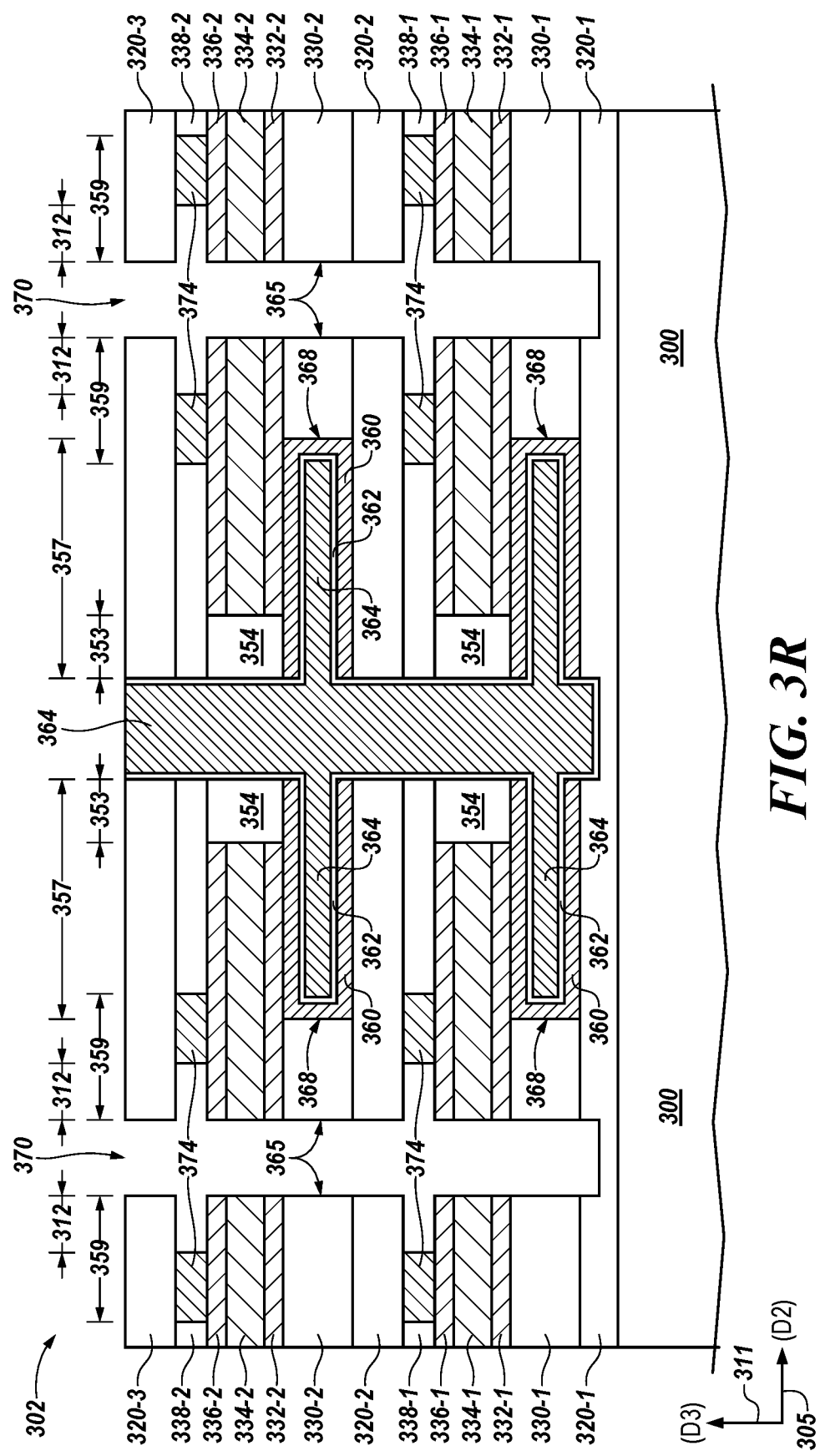
Figure 3S:
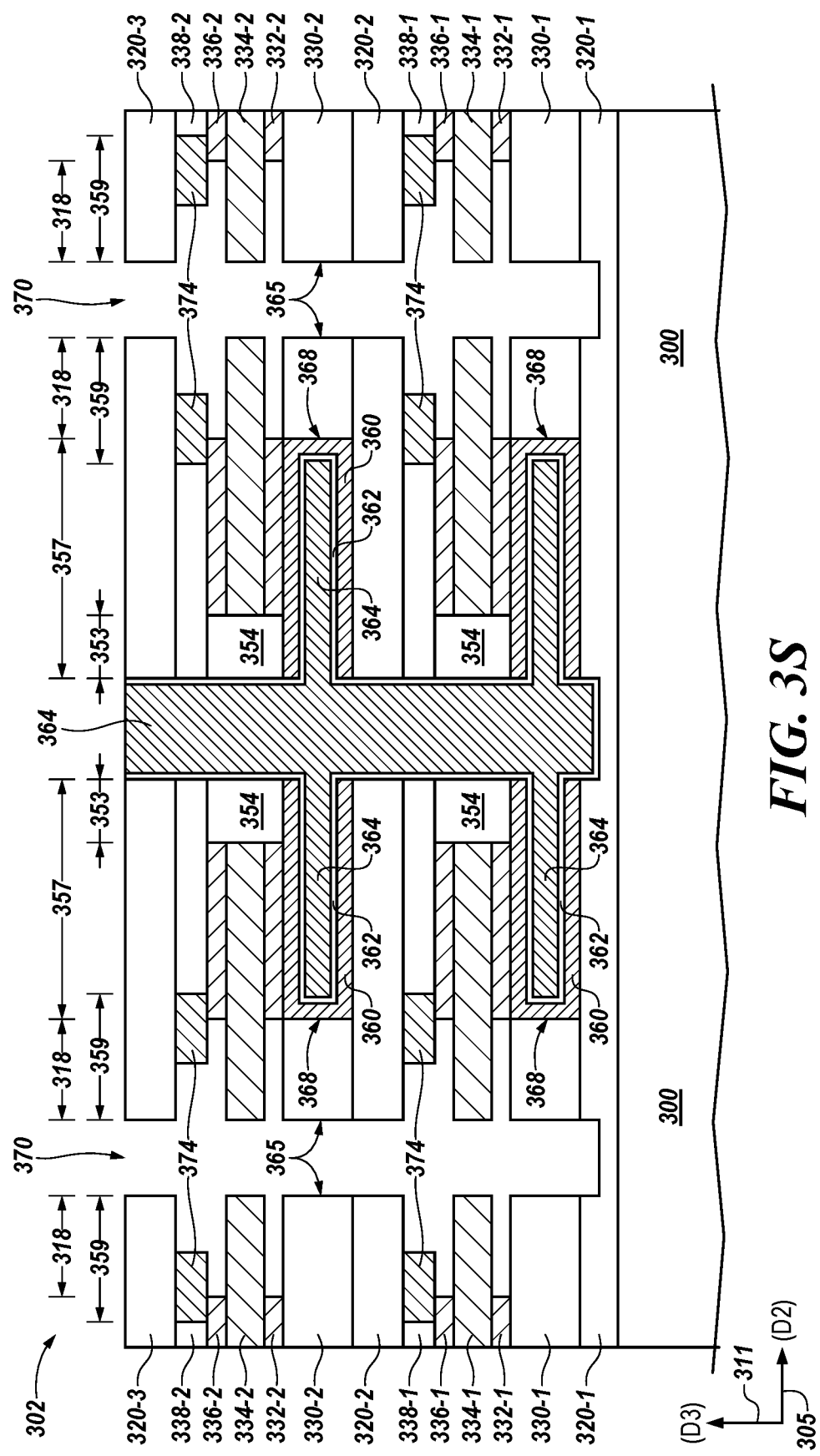
Figure 3T:
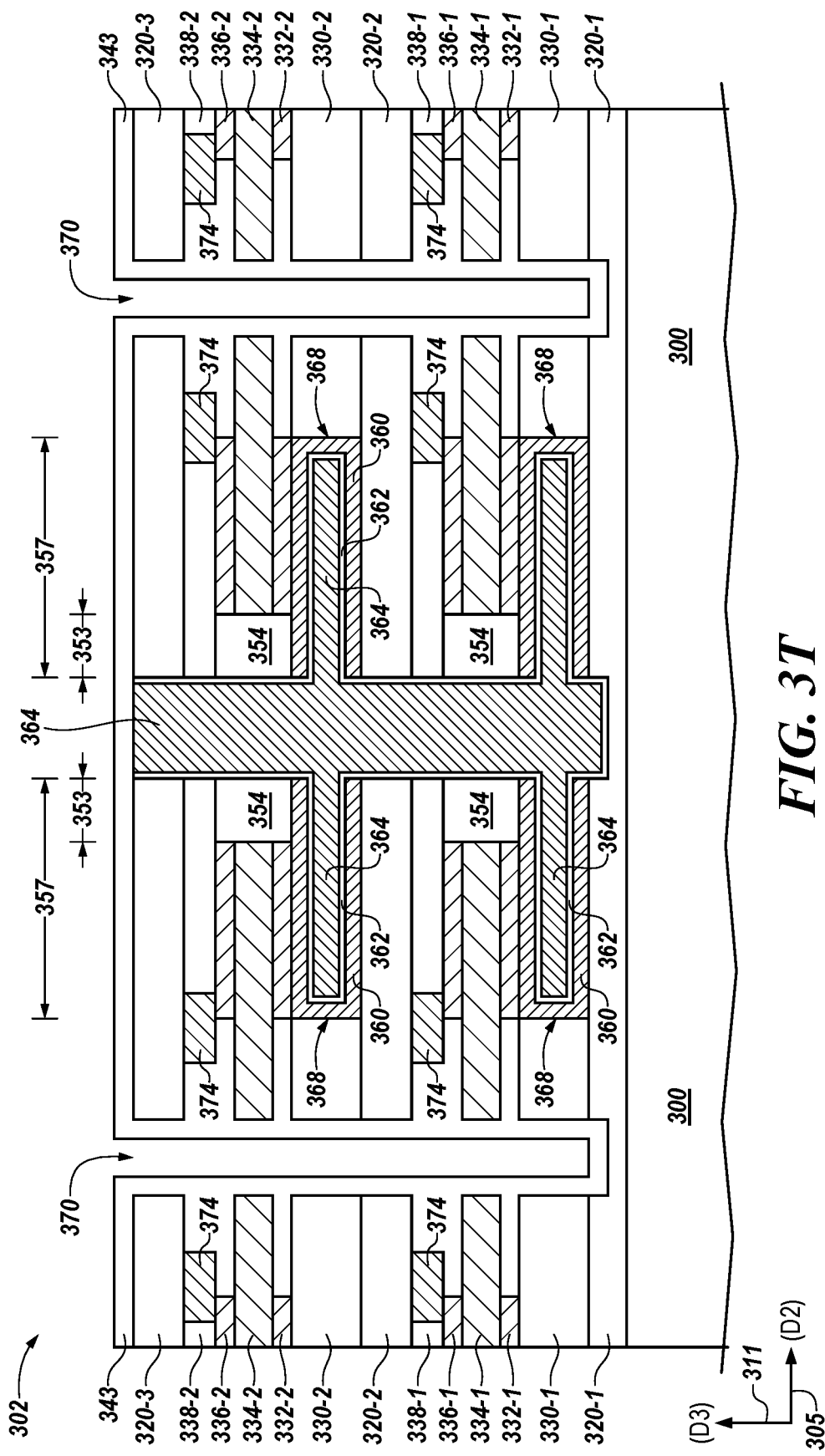
Figure 3U:
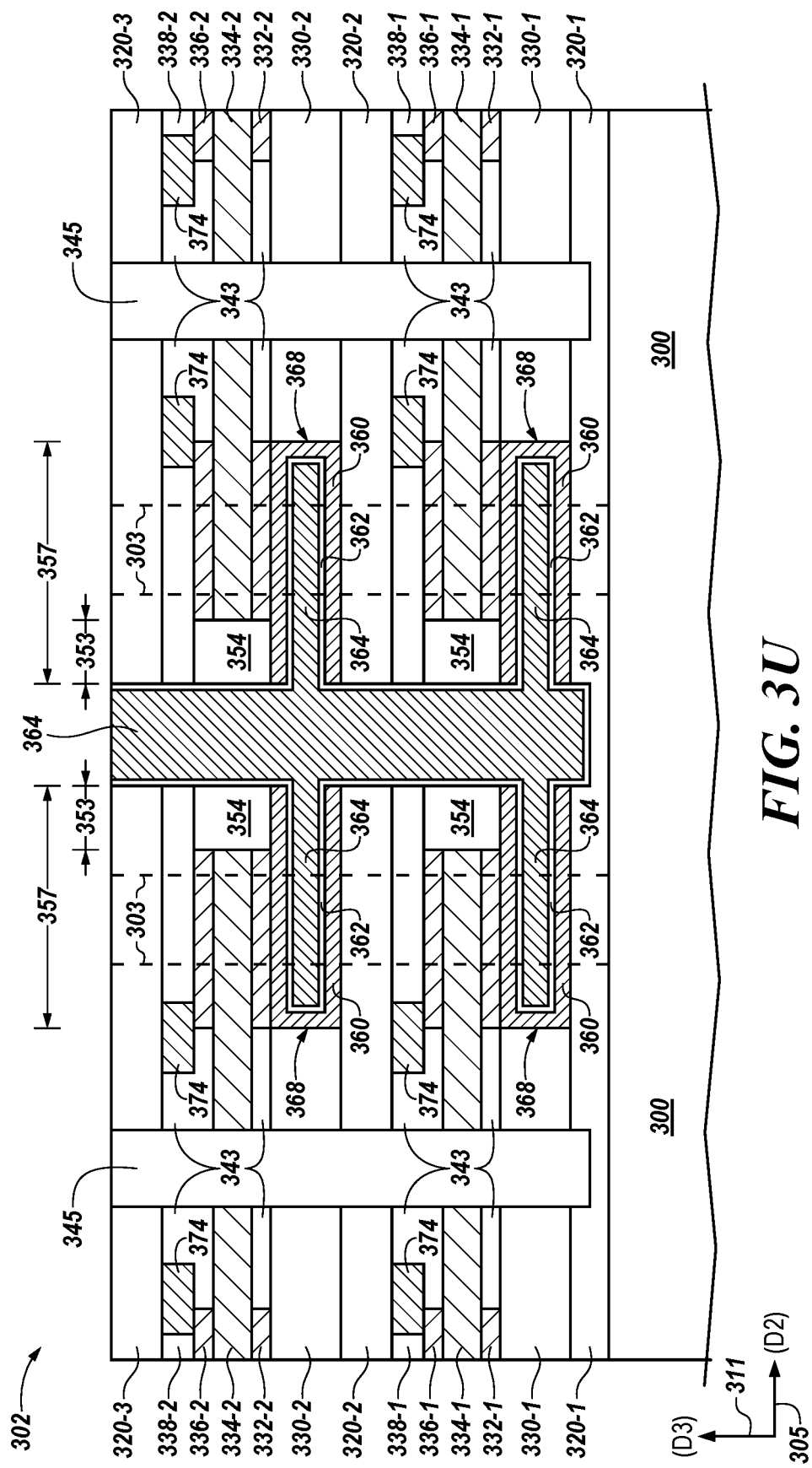
Figure 3V:
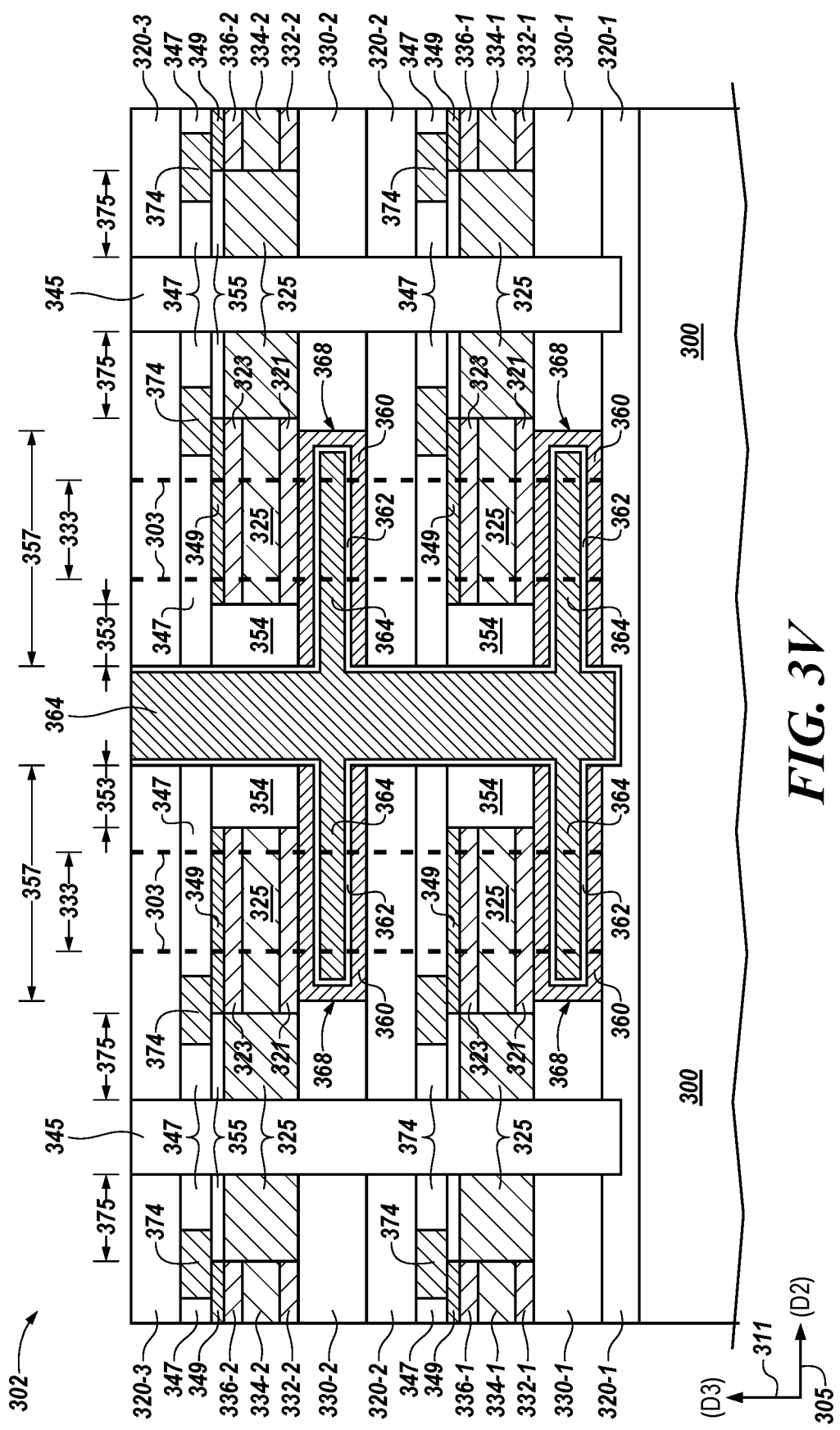

FIG. 3A-3V illustrate portions of vertically stacked memory cells, at various stages of a fabrication process, in accordance with a number of embodiments of the present disclosure. FIG. 3A is a cross-sectional view, at one stage of a fabrication process in accordance with the present disclosure.

As shown in FIG. 3A, alternating layers of a dielectric material, 320-1, 320-2, a dielectric material 330-1, 330-2, a first source/drain material 332-1, 332-2, a channel material 334-1, 334-2, a second source/drain material 336-1, 336-2, and a dielectric material 338-1, 338-2 may be deposited, e.g., sequentially deposited, to form a vertical stack 302 on a working surface of a semiconductor substrate 300. Embodiments provide that the dielectric material 320-1, 320-2 can be deposited to have a thickness, e.g., vertical height in the third direction (D3), in a range of 20 nanometers (nm) to 60 nm. Embodiments provide that the dielectric material 330-1, 330-2 can be deposited to have a thickness in a range of 20 nm to 80 nm. Embodiments provide that the first source/drain material 332-1, 332-2 can be deposited to have a thickness in a range of 10 nm to 60 nm. Embodiments provide that the channel material 334-1, 334-2 can be deposited to have a thickness in a range of 10 nm to 60 nm. Embodiments provide that the second source/drain material 336-1, 336-2 can be deposited to have a thickness in a range of 10 nm to 60 nm. Embodiments provide that the dielectric material 338-1, 338-2, which can be a nitride material, can be deposited to have a thickness in a range of 10 nm to 60 nm. Embodiments, however, are not limited to these examples.

The dielectric material 320-1, 320-2 may be an interlayer dielectric (ILD). By way of example, and not by way of limitation, the dielectric material, 320-1, 320-2, may comprise an oxide material, e.g., $SiO_2$. In another example the dielectric material, 320-1, 320-2, may comprise a silicon nitride ($Si_3N_4$) material (also referred to herein as "SiN"). In another example the dielectric material, 320-1, 320-2, may comprise a silicon oxy-carbide ($SiO_xC_y$) material. In another example the first material, 320-1, 320-2, may include silicon oxy-nitride ($SiO_xN_y$) material (also referred to herein as "SiON"), and/or combinations thereof. Embodiments are not limited to these examples.

The dielectric material 330-1, 330-2 may be referred to as a sacrificial material, as portions of this material may be selectively removed as discussed further herein. The dielectric material 330-1, 330-2 may be a dielectric material as discussed herein.

As mentioned, the vertical stack 302 includes the first source/drain material 332-1, 332-2 and the second source/drain material 336-1, 336-2. While first and second source/drain materials reference are used herein to denote two separate and distinct source/drain materials and/or regions, it is not intended that the reference to "first" and/or "second" have some unique meaning. It is intended only that one of the source/drain materials is connected to a digit line, as discussed further herein, and the other may be connected to a storage node.

The first 332-1, 332-2 and the second source/drain materials, 336-1, 336-2, can each include an n-type dopant region, e.g., semiconductor material, formed adjacent to a p-type doped channel region, e.g., semiconductor material, of the access device to form an n-type conductivity transistor. In some embodiments, the first 332-1, 332-2 and the second source/drain materials, 336-1, 336-2, may include a p-type conductivity, e.g., doped semiconductor material, formed adjacent to an n-type conductivity channel region, e.g., doped semiconductor material, of the access device to form a p-type conductivity transistor. By way of example, and not by way of limitation, the n-type dopant may include phosphorous (P) atoms and the p-type dopant may include boron (B) atoms formed in an oppositely doped body region of polysilicon semiconductor material. Embodiments, however, are not limited to these examples. Doping may occur during a deposition process, and/or doping may occur subsequently to a deposition process.

The channel material 334-1, 334-2 can include a suitable material, such as, silicon, germanium, silicon-germanium, and/or indium gallium zinc oxide (IGZO). As previously mentioned, regions of the channel material may be a p-type doped channel region or a n-type doped channel region.

One or more embodiments provide that a channel-oxide material, such as yttrium oxide ($Y_2O_3$), may be deposited in place of the channel material 334-1, 334-2. For such embodiments, portions of the channel-oxide material may be selectively removed for subsequent deposition of a channel material 334-1, 334-2 on remaining portions of the channel-oxide material, e.g., as illustrated in FIG. 3Q.

The dielectric material 338-1, 338-2 may be a nitride, such as a silicon nitride ($Si_3N_4$) material, which may also be referred to as "SiN", or a silicon oxynitride material, among others. The dielectric material 338-1, 338-2 may be a dielectric material as discussed herein.

The repeating iterations of alternating materials, e.g., dielectric material, 320-1, 320-2, dielectric material 330-1, 330-2, first source/drain material 332-1, 332-2, channel material 334-1, 334-2, second source/drain material 336-1, 336-2, and dielectric material 338-1, 338-2, may be deposited according to one or more fabrication processes for a semiconductor device, such as chemical vapor deposition (CVD). Embodiments, however, are not limited to this example and other suitable fabrication techniques may be used to deposit the alternating layers, in repeating iterations, to form the vertical stack 302. Suitable doping techniques may be utilized to form the vertical stack 302.

The layers of the materials in vertical stack 302 may occur in repeating iterations vertically. For instance, while FIG. 3A illustrates two instances of dielectric material 330-1, 330-2 and channel material 334-1, 334-2, etc. embodiment are not so limited. For example, more or fewer repeating iterations of the materials discussed herein may be included in vertical stack 302.

FIG. 3B illustrates a top down view of a semiconductor structure, at a particular point in time, in a semiconductor fabrication process, according to one or more embodiments. As shown in the example of FIG. 3B, the method comprises using an etchant process to form a plurality of first vertical openings 315, which may be referred to as access line vertical openings, having a first horizontal direction (D1) 309 and a second horizontal direction (D2) 305, through the vertical stack. In one example, as shown in FIG. 3B, the plurality of first vertical openings 315 are extending predominantly in the second horizontal direction (D2) 305 and may form elongated vertical, pillar columns 313 with sidewalls 314 in the vertical stack. The plurality of first vertical openings 315 may be formed using photolithographic techniques to pattern a photolithographic mask 335, e.g., to form a hard mask (HM), on the vertical stack prior to etching the plurality of first vertical openings 315.

FIG. 3C is a cross sectional view, taken along cut-line A-A' in FIG. 3B, showing another view of the semiconductor structure at a particular time in the fabrication process. The cross sectional view shown in FIG. 3C shows the repeating iterations of alternating layers of a dielectric material, 320-1, 320-2, dielectric material 330-1, 330-2, first source/drain material 332-1, 332-2, channel material 334-1, 334-2, second source/drain material 336-1, 336-2, and nitride material 338-1, 338-2, on the semiconductor substrate 300 to form the vertical stack, e.g. 302, as shown in FIG. 3A. FIG. 3C illustrates that a conductive material, 303-1, 303-2, . . . , 303-4, may be formed on a gate dielectric material 342 in the plurality of first vertical openings 315. By way of example and not by way of limitation, a gate dielectric material 315 may be conformally deposited in the plurality of first vertical openings 315 using a chemical vapor deposition (CVD) process, plasma enhanced CVD (PECVD), atomic layer deposition (ALD), or other suitable deposition process, to cover a bottom surface and the vertical sidewalls of the plurality of first vertical openings. The gate dielectric 342 may be deposited to a particular thickness (t1) as suited to a particular design rule, e.g., a gate dielectric thickness of approximately 10 nanometers (nm). Embodiments, however, are not limited to this example. By way of example, and not by way of limitation, the gate dielectric 342 may comprise a silicon dioxide ($SiO_2$) material, aluminum oxide ($Al_2O_3$) material, high dielectric constant (k), e.g., high-k, dielectric material, and/or combinations thereof. The gate dielectric 342 may include, for example, a silicon oxide material, a silicon nitride material, a silicon oxynitride material, etc., or a combination thereof. Embodiments are not so limited. For example, in high-k dielectric material examples the gate dielectric material 304 may include one or more of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, lead zinc niobite, etc.

Further, as shown in FIG. 3C, a conductive material, 303-1, 303-2, . . . , 303-4, may be conformally deposited in the plurality of first vertical openings 315 on a surface of the gate dielectric material 342. By way of example, and not by way of limitation, the conductive material, 303-1, 303-2, . . . , 303-4, may be conformally deposited in the plurality of first vertical openings 315 on a surface of the gate dielectric material 342 using a chemical vapor deposition process (CVD), plasma enhanced CVD (PECVD), atomic layer deposition (ALD), or other suitable deposition process, to cover a bottom surface and the vertical sidewalls of the plurality of first vertical openings over the gate dielectric 342. The conductive material, 303-1, 303-2, . . . , 303-4, may be conformally deposited to a particular thickness (t2) to form vertically oriented access lines, such as shown as access lines 103-1, 103-2, . . . , 103-Q, which also may be referred to as word lines, shown in FIG. 1, for instance, and as suited to a particular design rule. For example, the conductive material, 303-1, 303-2, . . . , 303-4, may be conformally deposited to a thickness of approximately 20 nm. Embodiments, however, are not limited to this example. By way of example, and not by way of limitation, the conductive material, 303-1, 303-2, . . . , 303-4, may comprise one or more of a doped semiconductor, e.g., doped silicon, doped germanium, etc., a conductive metal nitride, e.g., titanium nitride, tantalum nitride, etc., a metal, e.g., tungsten (W), titanium (Ti), tantalum (Ta), ruthenium (Ru), cobalt (Co), molybdenum (Mo), etc., and/or a metal-semiconductor compound, e.g., tungsten silicide, cobalt silicide, titanium silicide, etc, and/or some other combination thereof.

As shown in FIG. 3C, the conductive material, 303-1, 303-2, . . . , 303-4, may be recessed back to remain only along the vertical sidewalls of the elongated vertical, pillar columns, shown as 313-1, 313-2, and 313-3. The plurality of separate, vertical access lines formed from the conductive material, 303-1, 303-2, . . . , 303-4, may be recessed back by using a suitable selective, anisotropic etch process remove the conductive material, 303-1, 303-2, . . . , 303-4, from a bottom surface of the first vertical openings, e.g., 315, exposing the gate dielectric 342 on the bottom surface to form separate, vertical access lines, 303-1, 303-2, . . . , 303-4. As shown in FIG. 3C, a dielectric material 339, such as an oxide or other suitable spin on dielectric (SOD), may then be deposited in the first vertical openings 315, using a process such as CVD, to fill the first vertical openings 315. The dielectric may be planarized to a top surface of the hard mask 335 of the vertical stack, using chemical mechanical planarization (CMP) or other suitable semiconductor fabrication technique. A subsequent photolithographic material 336, e.g., hard mask, may be deposited using CVD and planarized using CMP to cover and close the first vertical openings 315 over the separate, vertical access lines, 303-1, 303-2, . . . , 303-4. Similar semiconductor process techniques may be used at other points of the fabrication process described herein.

FIG. 3D illustrates a view of the semiconductor structure at a particular time in the fabrication process in accordance with a number of embodiments of the present disclosure. In the example embodiment of FIG. 3D, the method comprises using a photolithographic process to pattern the photolithographic mask 336. The method in FIG. 3D, further illustrates using a selective, isotropic etchant process remove portions of the exposed conductive material to separate and individually form the plurality of separate, vertical access lines, 303-1, 303-2, . . . , 303 (N−1), 303-N, e.g., access lines 103-1, 103-2, . . . , 103-Q in FIG. 1. Hence the plurality of separate, vertical access lines, 303-1, 303-2, . . . , 303 (N−1), 303-N, are shown along the sidewalls of the elongated vertical, pillar columns, e.g., along sidewalls of the elongated vertical, pillar columns 313-1, 313-2, and 313-3, illustrated in the cross-sectional view of FIG. 3C. As illustrated in FIG. 3D, the vertical access lines, 303-1, 303-2, . . . , 303 (N−1), 303-N each have a width 333, along direction (D2) 305.

As shown in the example of FIG. 3D, the exposed conductive material, 303-1, 303-2, . . . , 303-(N−1), 640-N, may be removed back to the gate dielectric material 342 in the first vertical openings, e.g., 315 in FIG. 3B, using a suitable selective, isotropic etch process. As shown in FIG. 3D, a subsequent dielectric material 341, such as an oxide or other suitable spin on dielectric (SOD), may then be deposited to fill the remaining openings from where the exposed conductive material, 303-1, 303-2, . . . , 303-(N−1), 640-N, was removed using a process such as CVD, or other suitable technique. The dielectric material 341 may be planarized to a top surface of the previous hard mask 335 of the vertical semiconductor stack using a process such as CMP, or other suitable technique. In some embodiments, a subsequent photolithographic material, e.g., hard mask, may be deposited using CVD and planarized using CMP to cover and close the plurality of separate, vertical access lines, 303-1, 303-2, . . . , 303-(N−1), 640-N, over a working surface of the vertical semiconductor stack, leaving the plurality of separate, vertical access lines, 303-1, 303-2, . . . , 303-(N−1), 640-N, protected along the sidewalls of the elongated vertical, pillar columns 313-1, 313-2, . . . , 313-N. Embodiments, however, are not limited to these process examples.

FIG. 3E is a cross-sectional view, at one stage of a fabrication process in accordance with the present disclosure. FIG. 3E illustrates a portion of vertical stack 302. As shown in FIG. 3E, a vertical opening 350 can be formed in the vertical stack 302. The vertical opening 350 may be formed through the repeating iterations of the dielectric material, 320-1, 320-2, dielectric material 330-1, 330-2, first source/drain material 332-1, 332-2, channel material 334-1, 334-2, second source/drain material 336-1, 336-2, and nitride material 338-1, 338-2. Embodiments, however, are not limited to the vertical opening 350 shown in FIG. 3E. For instance, the vertical opening 350 may be formed through a different number of materials illustrated in FIG. 3E, e.g., at various locations of the vertical stack 302. Further, embodiments are not limited to the single vertical opening 350 shown in FIG. 3E. Multiple vertical openings may be formed through the layers of materials. The vertical opening 350 may be formed to expose vertical sidewalls in the vertical stack.

FIG. 3F is a cross-sectional view, at one stage of a fabrication process in accordance with the present disclosure. FIG. 3F illustrates a portion of vertical stack 302. One or more etchants may be flowed into the vertical opening 350 to selectively etch the first source/drain material 332-1, 332-2, the second source/drain material 336-1, 336-2, and the channel material 334-1, 334-2 and form horizontal openings 352. The horizontal openings 352 may be etched a distance 353 from a sidewall 351 formed by vertical opening 350. Embodiments provide that the distance 353 may be from 15 nm to 150 nm. The materials may be etched concurrently, or the materials may be etched sequentially. For instance, the first source/drain material 332-1, 332-2 and the second source/drain material 336-1, 336-2 may be etched prior to the channel material 334-1, 334-2 being etched; however, embodiments are not so limited. The etchant may target all iterations of a target material, e.g., a material to be etched, within the stack.

The selective etchant processes described herein may consist of one or more etch chemistries selected from a dry etch chemistry, an aqueous etch chemistry, a semi-aqueous etch chemistry, a vapor etch chemistry, or a plasma etch chemistry, or combinations thereof among other possible selective etch chemistries. Various known etchant materials may be utilized for the etchant process. For example, a dry etch chemistry of oxygen ($O_2$) or $O_2$, sulfur dioxide ($SO_2$) ($O_2/SO_2$) or of $O_2$, and nitrogen ($N_2$) ($O_2/N_2$) may be utilized. Also, a selective etch chemistry of phosphoric acid ($H_3PO_4$) or hydrogen fluoride (HF) and/or using a selective solvent, for example $NH_4OH$ or HF, among other possible etch chemistries or solvents may be employed.

FIG. 3G is a cross-sectional view, at one stage of a fabrication process in accordance with the present disclosure. FIG. 3G illustrates a portion of vertical stack 302. As illustrated in FIG. 3G, the vertical opening 350 and the horizontal openings 352 can be filled with a dielectric material 354. One or more embodiments provide that the dielectric material 354 may be planarized to a top surface of the vertical stack 302, e.g., using chemical mechanical planarization (CMP) or other suitable semiconductor fabrication technique. Dielectric material 354 may comprise a known dielectric material. Dielectric material 354 may comprise a dielectric material as discussed herein. Dielectric material 354 may be referred to as a first constraining dielectric material, as discussed herein, this dielectric material may be utilized to constrain a width of a first source/drain region, a second source/drain region, and a channel region.

FIG. 3H is a cross-sectional view, at one stage of a fabrication process in accordance with the present disclosure. FIG. 3H illustrates a portion of vertical stack 302. As shown in FIG. 3H, a portion of the previously deposited dielectric material 354 can be removed, e.g., via an anisotropic etch process, to form vertical opening 356. As shown in FIG. 3H, a portion of the previously deposited dielectric material 354 is maintained, e.g. to the distance 353 as previously discussed.

As further illustrated in FIG. 3H, subsequent to the formation of the vertical opening 356, the dielectric material 330-1, 330-2 may be selectively etched to form horizontal openings 358. The horizontal openings 356 may be etched a distance 357 from a sidewall 351 formed by vertical opening 356. Embodiments provide that the distance 357 may be from 50 nm to 400 nm. As mentioned, the selective etchant process may consist of one or more etch chemistries selected from an aqueous etch chemistry, a semi-aqueous etch chemistry, a vapor etch chemistry, or a plasma etch chemistries, among other possible selective etch chemistries. Various known etchant materials may be utilized for the etchant process. As illustrated in FIG. 3H, embodiments provide that the dielectric material 330-1, 330-2 may be selectively etched to form horizontal openings 358, while the material 354 is not etched. Selective etching of dielectric material 330-1, 330-2 while maintaining dielectric material 354 may be achieved by selecting different materials. In other words, the dielectric material 330-1, 330-2 may be a different material, having different etch properties, than dielectric material 354.

FIG. 3I is a cross-sectional view, at one stage of a fabrication process in accordance with the present disclosure. FIG. 3I illustrates a portion of vertical stack 302. As shown in FIG. 3I, a bottom electrode material 360 can be deposited, e.g. conformally, in the vertical opening 356 and in the horizontal openings 358. The bottom electrode material 360 can be deposited to have a thickness, e.g. a distance perpendicular from a surface that the bottom electrode material 360 is deposited on, from 15 to 65 nm. However, embodiments are not limited to this example and the bottom electrode 360 may be formed from conductive materials and to various thicknesses, as suited to a particular design rule for the formation of an operable capacitor for a semiconductor device. The bottom electrode material 360 can be a conductive material. Non-limiting examples of the bottom electrode material 360 include a platinum (Pt) material, a ruthenium (Ru) material, a titanium nitride (TiN) material, a doped TiN material, a tungsten (W) material, a molybdenum (Mo) material, a tantalum nitride (TaN) material, an aluminum (Al) material, a rhodium (Rh) material, a tungsten nitride (WN) material, and a ruthenium oxide (RuO2) material.

FIG. 3J is a cross-sectional view, at one stage of a fabrication process in accordance with the present disclosure. FIG. 3J illustrates a portion of vertical stack 302. As shown in FIG. 3J, portions of the bottom electrode material 360 can be removed, e.g., such that portions of the bottom electrode material 360 deposited in the horizontal openings 358 are maintained while portions of bottom electrode material 360 deposited elsewhere are removed. Portions of the bottom electrode material 360 can be removed by an atomic layer etching (ALE) process and/or other suitable techniques.

Further, as illustrated in FIG. 3J, a dielectric material 362 can be deposited, e.g. conformally, in the number of vertical openings 358. As shown in FIG. 3J, the dielectric material 362 is deposited in the horizontal openings 358, e.g. on the bottom electrode material 360. Dielectric material 362 may comprise a dielectric material as discussed herein. Dielectric material 362 may be formed from a high dielectric constant (high-k) material. Dielectric material 362 may include aluminum oxide ($Al_2O_3$), zirconium oxide ($SnO_2$), hafnium oxide ($HfO_2$), and/or lanthanum oxide ($La_2O_3$). One or more embodiments provide that $ZrO_2$(Zr oxide), $HfO_2$(Hf oxide), $La_2O_3$(La oxide), PZT (Lead Zirconate Titanate, Pb[Zr(x)Ti(1−x)]O3), $BaTiO_3$, $Al_2O_3$ or combinations thereof may be utilized, for example. One or more embodiments provide that the dielectric material 362 is a zirconium oxide material. The dielectric material 362 may be doped, e.g., with Si or Al from 0.1% to 5%. The dielectric material 362 can be deposited to have a thickness, e.g. a distance perpendicular from a surface the dielectric material 362 is deposited on, from 10 to 70 nm. Embodiments are not limited to these example materials or thickness for the dielectric material.

FIG. 3K is a cross-sectional view, at one stage of a fabrication process in accordance with the present disclosure. FIG. 3K illustrates a portion of vertical stack 302. As shown in FIG. 3K, a top electrode material 364 can be deposited in the vertical opening 356. As shown in FIG. 3K, the top electrode material 364 is deposited in the horizontal openings 358, e.g. on the dielectric material 362. Depositing the top electrode material 364 forms a capacitor 368, i.e. a metal-insulator-metal capacitor, in each of the horizontal openings 358. As illustrated in FIG. 3K, one or more embodiments provide that the top electrode material 364 is a common electrode material for each of the respective capacitors 368 formed with the top electrode material 364. The top electrode material 364 can be a conductive material. Non-limiting examples of the top electrode material 364 include a platinum (Pt) material, a ruthenium (Ru) material, a titanium nitride (TiN) material, a doped TiN material, a tungsten (W) material, a molybdenum (Mo) material, a tantalum nitride (TaN) material, an aluminum (Al) material, a rhodium (Rh) material, a tungsten nitride (WN) material, and a ruthenium oxide ($RuO_2$) material. The top electrode material 364 may have a thickness from 10 to 40 nm. Embodiments are not limited to these example materials or thickness for the top electrode material 364.

FIG. 3L is a cross-sectional view, at one stage of a fabrication process in accordance with the present disclosure. FIG. 3L illustrates a portion of vertical stack 302. As shown in FIG. 3L, a number of vertical openings 370 are formed in the vertical stack 302. The vertical openings 370 can be similar, e.g. the same as other than location, to the vertical openings 350 as previously discussed; however, embodiments are not so limited. While FIG. 3L illustrates that the vertical openings 370 are formed subsequently to forming the capacitors 368, embodiments are not so limited.

FIG. 3M is a cross-sectional view, at one stage of a fabrication process in accordance with the present disclosure. FIG. 3M illustrates a portion of vertical stack 302. As shown in FIG. 3M, portions of the nitride material 338-1, 338-2 can be selectively removed to form horizontal openings 372.

The horizontal openings 372 may be etched a distance 359 from a sidewall 365 formed by vertical opening 370. Embodiments provide that the distance 359 may be from 50 nm to 400 nm. As mentioned, the selective etchant process may consist of one or more etch chemistries selected from an aqueous etch chemistry, a semi-aqueous etch chemistry, a vapor etch chemistry, or a plasma etch chemistries, among other possible selective etch chemistries. Various known etchant materials may be utilized for the etchant process.

FIG. 3N is a cross-sectional view, at one stage of a fabrication process in accordance with the present disclosure. FIG. 3N illustrates a portion of vertical stack 302. As shown in FIG. 3N, a conductive material 374 may be deposited in the vertical opening 370. As an example, the conductive material 374 may be a metal, e.g., tungsten (W), titanium (Ti), tantalum (Ta), ruthenium (Ru), cobalt (Co), molybdenum (Mo), etc., and/or a metal-semiconductor compound, e.g., tungsten silicide, cobalt silicide, titanium silicide, etc. As illustrated in FIG. 3N the deposited conductive material 374 may not fill the vertical opening 370. However, embodiments are not so limited. A number of embodiments provide that the deposited conductive material 374 fills vertical opening 370. Also, as shown in FIG. 3N, the conductive material 374 is deposited in the horizontal openings 372. Embodiments provide that the conductive material 374 fills the horizontal openings 372.

FIG. 3O is a cross-sectional view, at one stage of a fabrication process in accordance with the present disclosure. FIG. 3O illustrates a portion of vertical stack 302. As shown in FIG. 3O, portions of the deposited conductive material 374 can be removed from regions of the vertical stack 302, e.g., portions of the deposited conductive material 374 can be removed to expose sidewalls 365. As portions of the deposited conductive material 374 can be removed from regions of the vertical stack 302, one or more embodiments of the present discourse provide that the remaining deposited conductive material 374 portions may be utilized as digit lines, e.g., digit lines 107-1, 107-2, . . . , 107-P illustrated in FIG. 1 and digit lines 207-1, 207-2, . . . , 207-P illustrated in FIG. 2. However, embodiments are not so limited. For instance, the conductive material 374 may be utilized as a digit line contact material. When utilizing the conductive material 374 as a digit line contact material, the digit lines, e.g., digit lines 107-1, 107-2, . . . , 107-P illustrated in FIG. 1 and digit lines 207-1, 207-2, . . . , 207-P illustrated in FIG. 2, may be formed according to process steps for digit line formation as described in co-pending U.S. patent application Ser. No. 16/943,108, entitled "Digit Line Formation for Horizontally Oriented Access Devices", while, the present disclosure is directed toward vertically oriented access devices.

Also, as illustrated in FIG. 3O, one or more etchants may be utilized to selectively etch the first source/drain material 332-1, 332-2, the second source/drain material 336-1, 336-2, and the channel material 334-1, 334-2 and form horizontal openings 376. The horizontal openings 376 may be etched a distance 375 from a sidewall 365. Embodiments provide that the distance 375 may be from 15 nm to 150 nm. The materials may be etched concurrently, or the materials may be etched sequentially. For instance, the first source/drain material 332-1, 332-2 and the second source/drain material 336-1, 336-2 may be etched prior to the channel material 334-1, 334-2 being etched; however, embodiments are not so limited. The etchant may target all iterations of a target material, e.g., a material to be etched, within the stack.

FIG. 3P is a cross-sectional view, at one stage of a fabrication process in accordance with the present disclosure. FIG. 3P illustrates a portion of vertical stack 302. As shown in FIG. 3P, the horizontal openings 376 can be filled with a dielectric material 380. In other words, the dielectric material may fill the distance 375. One or more embodiments provide that the dielectric material 380 may be planarized to a top surface of the vertical stack 302, e.g., using chemical mechanical planarization (CMP) or other suitable semiconductor fabrication technique. Dielectric material 380 may comprise a known dielectric material. Dielectric material 380 may comprise a dielectric material as discussed herein.

Filling the horizontal openings 376 with the dielectric material 380 can be utilized to form vertically oriented access devices 330. As illustrated in FIG. 3P, the vertically oriented access devices 330 are respectively vertically adjacent, e.g., formed in contact with and formed on, to respective horizontally oriented storage nodes 368. Dielectric material 380 may be referred to as a second constraining dielectric material, as discussed herein, this dielectric material may be utilized to constrain a width of a first source/drain region, a second source/drain region, and a channel region.

As illustrated in FIG. 3P, the vertically oriented access devices 330 each include a respective first source/drain region 321, a channel region 325, and a second source/drain region 323. The vertically oriented access device 330 includes the vertical channel region 325, e.g., conduction through the access device is from source to drain in the vertical (D3) direction 311. The first source/drain regions 321 are respectively formed from the first source/drain materials 332-1, 332-2. The channel regions 325 are respectively formed from the channel materials 334-1, 334-2. The second source/drain regions 323 are respectively formed from the second source/drain materials 336-1, 336-2. The first source/drain region 321 is vertically separated from the second source/drain region 323 by the channel region 325.

The first source/drain region 321, the channel region 325, and the second source/drain region 323 are constrained, e.g. bounded by, along the second horizontal direction (D2) 305 by dielectric material 354 and dielectric material 380 to provide the vertically oriented access devices 330 have a width 331. The first source/drain region 321, the channel region 325, and the second source/drain region 323 each contact dielectric material 354 and dielectric material 380.

As illustrated in FIG. 3P, the width 331 of access device 330 may be greater than the width 333 of access line 303. However, embodiments are not so limited. One or more embodiments provide that the width 331 of access device 330 is equal to the width 333 of access line 303. One or more embodiments provide that the width 331 of access device 330 is less than the width 333 of access line 303. By varying the distance 353 filled with dielectric material 354 and/or the distance 375 filled with dielectric material 380, various widths 331 of access device 330 may be obtained.

FIG. 3Q is a cross-sectional view, at one stage of a fabrication process in accordance with the present disclosure. FIG. 3Q illustrates a portion of vertical stack 302. As illustrated in FIG. 3Q, the channel-oxide material 381 was deposited in place of the channel material 334-1, 334-2. For instance, a channel-oxide, such as yttrium oxide ($Y_2O_3$), may be deposited in place of the channel material 334-1, 334-2. For FIG. 3Q, processes described herein are utilized to selectively remove portions of the channel-oxide material 381. Following the selectively removal of portions of the channel-oxide material 381 the channel material 334-1, 334-2, e.g., AC1, can be deposited to form the semiconductor device. Embodiments provide that the channel-oxide material 381 can have a width 382 in the direction (D2) from 10 nm to 35 nm.

FIG. 3R is a cross-sectional view, at one stage of a fabrication process in accordance with the present disclosure. FIG. 3R illustrates a portion of vertical stack 302. The cross-sectional view shown in FIG. 3R, may be obtained in accordance with a number of fabrication steps discussed herein, for example following FIG. 3N as previously discussed. As shown in FIG. 3R, portions of the deposited conductive material 374 can be removed from regions of the vertical stack 302, e.g., portions of the deposited conductive material 374 can be removed to expose sidewalls 365. Further, as shown in FIG. 3R, the conductive material 374 can be etched a distance 312 from the sidewall 365 formed by vertical opening 370.

FIG. 3S is a cross-sectional view, at one stage of a fabrication process in accordance with the present disclosure. FIG. 3S illustrates a portion of vertical stack 302. As shown in FIG. 3S, portions of the first source/drain material 332-1, 332-2 and the second source/drain material 336-1, 336-2 can be removed. The first source/drain material 332-1, 332-2 can be etched a distance 318 from the sidewall 365 formed by vertical opening 370.

FIG. 3T is a cross-sectional view, at one stage of a fabrication process in accordance with the present disclosure. FIG. 3T illustrates a portion of vertical stack 302. As shown in FIG. 3T, a dielectric material 343 can be deposited in the spaces formed by removing portions of the conductive material 374 and portions of the first source/drain material 332-1, 332-2 and the second source/drain material 336-1, 336-2.

FIG. 3U is a cross-sectional view, at one stage of a fabrication process in accordance with the present disclosure. FIG. 3U illustrates a portion of vertical stack 302. As shown in FIG. 3U, a body contact material 345 can be deposited in the vertical openings 370. The body contact material 345 may be utilized to provide body bias control to a region of the vertically oriented access device, for instance. The body contact material 345 may include a conductive material such as, for example, one of a doped semiconductor material, a conductive metal nitride, metal, and/or a metal-semiconductor compound.

FIG. 3V is a cross-sectional view, at one stage of a fabrication process in accordance with the present disclosure. The cross-sectional view shown in FIG. 3V, may be obtained in accordance with a number of fabrication steps discussed herein. As illustrated in FIG. 3V, the vertical stack 302 may include one or more additional alternating layers of materials. FIG. 3V illustrates the conductive material 374 and a dielectric material 347 formed in a layer. These materials may be formed in accordance with a number of fabrication steps discussed herein.

One or more embodiments provide that vertical stack 302 may include a layer comprising a conductive material 347 and a dielectric material 355. The layer comprising the conductive material 347 and the dielectric material 355 may be located between the layer comprising the conductive material 374 and the layer respectively comprising the second source/drain material 336-1, 336-2. The conductive material 347 and a dielectric material 355 may be formed in accordance with a number of fabrication steps discussed herein. Further, as illustrated in FIG. 3V portions of the first source/drain material 332-1, 332-2, the channel material 334-1, 334-2, e.g., a first channel material, the second source/drain material 336-1, 336-2 may be removed, e.g., by one or more selective etch processes to a distance 375. After portions of the first source/drain material 332-1, 332-2, the channel material 334-1, 334-2, the second source/drain material 336-1, 336-2 are removed, a channel material 325, e.g., a second channel material, may be deposited. One or more embodiments provide that the first channel material and the second channel material are a same material. One or more embodiments provide that the first channel material and the second channel material are different materials. Also, as previously discussed, the body contact material 345 can be deposited provide body bias control to a region of the vertically oriented access device, for instance.

Figure 4:
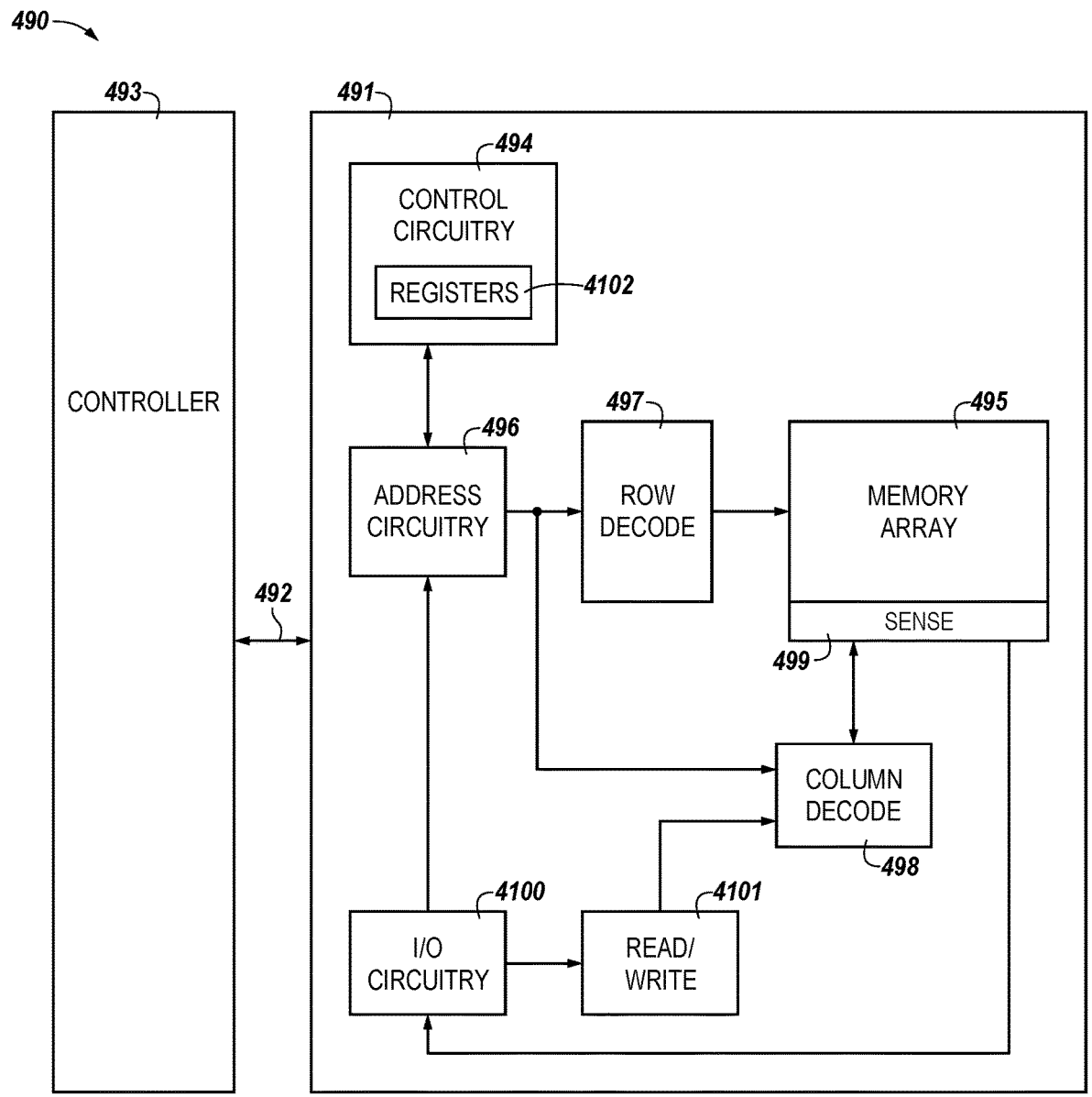
FIG. 4 is a block diagram of an apparatus in the form of a computing system including a memory device in accordance with a number of embodiments of the present disclosure.

FIG. 4 is a block diagram of an apparatus in the form of a computing system including a memory device in accordance with a number of embodiments of the present disclosure. The computing system 490 includes a memory device 491, as described herein, in accordance with a number of embodiments of the present disclosure. As used herein, a memory device 491, a memory array 495, and/or a host 493, for example, might also be separately considered an "apparatus." According to embodiments, the memory device 491 may comprise at least one memory array 495 according to the embodiments described herein.

In this example, system 490 includes a host 493 coupled to memory device 491 via an interface 492. The computing system 490 can be a personal laptop computer, a desktop computer, a digital camera, a mobile telephone, a memory card reader, or an Internet-of-Things (IoT) enabled device, among various other types of systems. Host 493 can include a number of processing resources (e.g., one or more processors, microprocessors, or some other type of controlling circuitry) capable of accessing memory 491. The system 490 can include separate integrated circuits, or both the host 493 and the memory device 491 can be on the same integrated circuit. For example, the host 493 may be a system controller of a memory system comprising multiple memory devices 491, with the system controller 494 providing access to the respective memory devices 491 by another processing resource such as a central processing unit (CPU).

In the example shown in FIG. 14, the host 493 is responsible for executing an operating system (OS) and/or various applications (e.g., processes) that can be loaded thereto (e.g., from memory device 491 via controller 494). The OS and/or various applications can be loaded from the memory device 491 by providing access commands from the host 493 to the memory device 491 to access the data comprising the OS and/or the various applications. The host 493 can also access data utilized by the OS and/or various applications by providing access commands to the memory device 491 to retrieve said data utilized in the execution of the OS and/or the various applications.

For clarity, the system 490 has been simplified to focus on features with particular relevance to the present disclosure. The memory array 495 can be a DRAM array comprising at least one memory cell formed according to the techniques described herein. For example, the memory array 495 can be an unshielded DL 4F2 array such as a 3D-DRAM memory array. The array 495 can comprise memory cells arranged in rows coupled by word lines, e.g., access lines or select lines, and columns coupled by digit lines, e.g., sense lines or data lines. Although a single array 495 is shown in FIG. 4, embodiments are not so limited. For instance, memory device 491 may include a number of arrays 495, e.g., a number of banks of DRAM cells.

The memory device 491 includes address circuitry 496 to latch address signals provided over an interface 492. The interface can include, for example, a physical interface employing a suitable protocol, e.g., a data bus, an address bus, and a command bus, or a combined data/address/command bus. Such protocol may be custom or proprietary, or the interface 492 may employ a standardized protocol, such as Peripheral Component Interconnect Express (PCIe), Gen-Z, CCIX, or the like. Address signals are received and decoded by a row decoder 497 and a column decoder 498 to access the memory array 495. Data can be read from memory array 495 by sensing voltage and/or current changes on the sense lines using sensing circuitry 499. The sensing circuitry 499 can comprise, for example, sense amplifiers that can read and latch a page, e.g., row, of data from the memory array 495. The I/O circuitry 4100 can be used for bi-directional data communication with the host 493 over the interface 492. The read/write circuitry 4101 is used to write data to the memory array 495 or read data from the memory array 495. As an example, the circuitry 4101 can comprise various drivers, latch circuitry, etc.

Control circuitry 494 decodes signals provided by the host 493. The signals can be commands provided by the host 493. These signals can include chip enable signals, write enable signals, and address latch signals that are used to control operations performed on the memory array 495, including data read operations, data write operations, and data erase operations. In various embodiments, the control circuitry 494 is responsible for executing instructions from the host 493. The control circuitry 494 can comprise a state machine, a sequencer, and/or some other type of control circuitry, which may be implemented in the form of hardware, firmware, or software, or any combination of the three. In some examples, the host 493 can be a controller external to the memory device 491. For example, the host 493 can be a memory controller which is coupled to a processing resource of a computing device.

The term semiconductor can refer to, for example, a material, a wafer, or a substrate, and includes any base semiconductor structure. "Semiconductor" is to be understood as including silicon-on-sapphire (SOS) technology, silicon-on-insulator (SOI) technology, thin-film-transistor (TFT) technology, doped and undoped semiconductors, epitaxial silicon supported by a base semiconductor structure, as well as other semiconductor structures. Furthermore, when reference is made to a semiconductor in the preceding description, previous process steps may have been utilized to form regions/junctions in the base semiconductor structure, and the term semiconductor can include the underlying materials containing such regions/junctions.

As used herein, "a number of" or a "quantity of" something can refer to one or more of such things. For example, a number of or a quantity of memory cells can refer to one or more memory cells. A "plurality" of something intends two or more. As used herein, multiple acts being performed concurrently refers to acts overlapping, at least in part, over a particular time period. As used herein, the term "coupled" may include electrically coupled, directly coupled, and/or directly connected with no intervening elements (e.g., by direct physical contact), indirectly coupled and/or connected with intervening elements, or wirelessly coupled. The term coupled may further include two or more elements that co-operate or interact with each other (e.g., as in a cause and effect relationship). An element coupled between two elements can be between the two elements and coupled to each of the two elements.

It should be recognized the term vertical accounts for variations from "exactly" vertical due to routine manufacturing, measuring, and/or assembly variations and that one of ordinary skill in the art would know what is meant by the term "perpendicular." For example, the vertical can correspond to the z-direction. As used herein, when a particular element is "adjacent to" an other element, the particular element can cover the other element, can be over the other element or lateral to the other element and/or can be in direct physical contact the other element. Lateral to may refer to the horizontal direction (e.g., the y-direction or the x-direction) that may be perpendicular to the z-direction, for example.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

What is claimed is:

1. A memory device, comprising:
    an array of vertically stacked memory cells, the array of vertically stacked memory cells, comprising:
        vertically oriented access devices each respectively having a first source/drain region and a second source/drain region vertically separated by a channel region, wherein the channel region has a horizontal width constrained by a first dielectric material and a second dielectric material,
        and gates opposing the channel region and separated therefrom by a gate dielectric;
        vertically oriented access lines coupled to the gates and separated from the channel region by the gate dielectric;
        horizontally oriented storage nodes electrically coupled to the respective first source/drain regions of the vertically oriented access devices, wherein the horizontally oriented storage nodes are respectively vertically adjacent to the vertically oriented access devices; and
        horizontally oriented digit lines electrically coupled to the second source/drain regions of the vertically oriented access devices.

2. The memory device of claim 1, wherein respective portions of the channel regions are separated by an oxide material.

3. The memory device of claim 2, wherein the oxide material is yttrium oxide.

4. The memory device of claim 1, wherein the horizontal width of the channel region is greater than a horizontal width of the vertically oriented access lines.

5. The memory device of claim 1, wherein the horizontal width of the channel region is less than a horizontal width of the vertically oriented access lines.

6. The memory device of claim 1, wherein the horizontal width of the channel region is equal to a horizontal width of the vertically oriented access lines.

7. The memory device of claim 1, wherein each of the horizontally oriented storage nodes includes a respective bottom electrode material, a respective insulator material, and a respective top electrode material.

8. The memory device of claim 7, wherein each of the top electrode material is a common electrode material for a plurality of horizontally oriented storage nodes.

9. The memory device of claim 7, wherein each of the respective bottom electrode materials contact a respective second source/drain region.

10. The memory device of claim 1, wherein the horizontally oriented storage nodes are metal-insulator-metal capacitors.

11. The memory device of claim 1, further comprising a body contact.

12. A method for forming arrays of vertically stacked memory cells, having vertically oriented access devices and vertically oriented access lines, comprising:
sequentially depositing layers of a first dielectric material, a second dielectric material, a first source/drain material, a channel material, a second source/drain material, and a third dielectric material in repeating iterations vertically to form a vertical stack;
forming a first vertical opening using a first etchant process to expose first vertical sidewalls in the vertical stack;
selectively etching the second dielectric material to form a first horizontal opening from the first vertical opening;
depositing a bottom electrode material, an insulator material, a top electrode material in the first horizontal opening to form a horizontally oriented storage node, wherein the bottom electrode material is vertically adjacent the first source/drain material.

13. The method of claim 12, further comprising:
forming a second vertical opening using a second etchant process to expose second vertical sidewalls in the vertical stack;
selectively etching the third dielectric material to form a second horizontal opening from the second vertical opening; and
depositing a metal in the second horizontal opening to form a horizontally oriented digit line, wherein the metal contacts the second source/drain material.

14. The method of claim 13, wherein the metal is vertically adjacent to the second source/drain material.

15. The method of claim 12, further comprising:
selectively etching the first source/drain material, the channel material; and the second source/drain material to form a third horizontal opening;
selectively etching the first source/drain material, the channel material; the second source/drain material to form a fourth horizontal opening; and
depositing a first constraining dielectric material in the third horizontal opening and depositing a second constraining dielectric material in the fourth horizontal opening to form a vertically oriented access device from remaining portions of the first source/drain material, the channel material, and the second source/drain material.

16. The method of claim 15, further comprising:
forming an access line vertical opening using an access line etchant process to expose vertical sidewalls in the vertical stack; and
depositing a conductive material in the access line vertical opening to form a vertical access line.

17. The method of claim 16, wherein the vertically oriented access device has a horizontal width greater than a horizontal width of the vertical access line.

18. The method of claim 16, wherein the vertically oriented access device has a horizontal width less than a horizontal width of the vertical access line.

19. The method of claim 16, wherein the vertically oriented access device has a horizontal width equal to a horizontal width of the vertical access line.

20. The method of claim 15, further comprising:
depositing a conductive material to form a body contact, where the conductive material contacts the channel material.

21. A method for forming arrays of vertically stacked memory cells, having vertically oriented access devices and vertically oriented access lines, comprising:
sequentially depositing layers of a first dielectric material, a second dielectric material, a first source/drain material, a channel-oxide material, a second source/drain material, and a third dielectric material in repeating iterations vertically to form a vertical stack;
forming a first vertical opening using a first etchant process to expose first vertical sidewalls in the vertical stack;
selectively etching the second dielectric material to form a first horizontal opening from the first vertical opening;
depositing a bottom electrode material, an insulator material, a top electrode material in the first horizontal opening to form a horizontally oriented storage node, wherein the bottom electrode material is vertically adjacent the first source/drain material;
forming a second vertical opening using a second etchant process to expose second vertical sidewalls in the vertical stack;
selectively etching the channel-oxide material to form a second horizontal opening from the second vertical opening; and
depositing a channel material on a remaining portion of the channel-oxide material in the second horizontal opening.

22. The method of claim 21, further comprising:
selectively etching the third dielectric material to form a third horizontal opening from the second vertical opening; and
depositing a metal in the second horizontal opening to form a horizontally oriented digit line, wherein the metal contacts the second source/drain material.

23. The method of claim 22, wherein the metal is vertically adjacent to the second source/drain material.

24. The method of claim 22, further comprising:
selectively etching the first source/drain material, the channel material, and the second source/drain material to form a fourth horizontal opening from the second vertical opening, and
depositing a dielectric material in the fourth horizontal opening to form a vertically oriented access device.

25. The method of claim 22, further comprising:
selectively etching the first source/drain material, the channel material, and the second source/drain material to form a fourth horizontal opening from the second vertical opening, wherein the channel material is a first channel material; and
depositing a second channel material in the second vertical opening;
depositing a conductive material that contacts the second channel material to form a body contact.

26. The method of claim 25, wherein the first channel material and the second channel material are a same material.

27. The method of claim 25, wherein the first channel material and the second channel material are different materials.

28. The method of claim 21, wherein the channel-oxide material is yttrium oxide.

* * * * *